(12) United States Patent
Yamaguchi et al.

(10) Patent No.: US 11,640,916 B2
(45) Date of Patent: May 2, 2023

(54) SUBSTRATE PROCESSING APPARATUS AND SUBSTRATE PROCESSING METHOD

(71) Applicant: SCREEN Holdings Co., Ltd., Kyoto (JP)

(72) Inventors: Takahiro Yamaguchi, Kyoto (JP); Jun Sawashima, Kyoto (JP); Akihisa Ensatsu, Kyoto (JP)

(73) Assignee: SCREEN Holdings Co., Ltd.

( * ) Notice: Subject to any disclaimer, the term of this patent is extended or adjusted under 35 U.S.C. 154(b) by 0 days.

(21) Appl. No.: 17/443,345

(22) Filed: Jul. 26, 2021

(65) Prior Publication Data

US 2022/0068682 A1    Mar. 3, 2022

(30) Foreign Application Priority Data

Aug. 28, 2020  (JP) .............................. JP2020-145033

(51) Int. Cl.
| | |
|---|---|
| *H01L 21/677* | (2006.01) |
| *H01L 21/67* | (2006.01) |
| *B65G 47/90* | (2006.01) |
| *H01L 21/687* | (2006.01) |

(52) U.S. Cl.
CPC ........ *H01L 21/67703* (2013.01); *B65G 47/90* (2013.01); *H01L 21/67167* (2013.01); *H01L 21/67173* (2013.01); *H01L 21/67178* (2013.01); *H01L 21/67769* (2013.01); *H01L 21/68707* (2013.01)

(58) Field of Classification Search
CPC ......... H01L 21/67703; H01L 21/67167; H01L 21/67173; H01L 21/67178; H01L 21/67769; H01L 21/68707; B65G 47/90
See application file for complete search history.

(56) References Cited

U.S. PATENT DOCUMENTS

| | | | |
|---|---|---|---|
| 2006/0251817 A1* | 11/2006 | Hara ................. | H01L 21/67745 118/66 |
| 2007/0147832 A1* | 6/2007 | Shigemori ........ | H01L 21/67276 396/611 |
| 2008/0142051 A1 | 6/2008 | Hashizume ..................... | 134/23 |

(Continued)

FOREIGN PATENT DOCUMENTS

| | | |
|---|---|---|
| JP | 2008-153521 A | 7/2008 |
| JP | 2009-010291 A | 1/2009 |

(Continued)

*Primary Examiner* — Gerald McClain
(74) *Attorney, Agent, or Firm* — Ostrolenk Faber LLP

(57) ABSTRACT

A substrate processing apparatus includes an indexer block and a processing block adjacent to the indexer block in a lateral direction of the indexer block. A plurality of processing block layers are stacked in an up-down direction in the processing block. The indexer block includes a container holding portion and a first transfer robot that transfers a substrate between the substrate container held by the container holding portion and the processing block. Each of the processing block layers includes a plurality of processing units, a substrate placing portion, a dummy-substrate housing portion, and a second transfer robot that transfers a substrate between the substrate placing portion and the plurality of processing units and that transfers a dummy substrate between the dummy-substrate housing portion and the plurality of processing units.

15 Claims, 9 Drawing Sheets

(56) References Cited

U.S. PATENT DOCUMENTS

| | | | | |
|---|---|---|---|---|
| 2009/0000543 | A1 | 1/2009 | Fukutomi et al. | 118/58 |
| 2010/0102030 | A1* | 4/2010 | Kondoh | H01L 21/67778 |
| | | | | 216/58 |
| 2020/0211870 | A1 | 7/2020 | Takayama et al. | |
| 2021/0358781 | A1* | 11/2021 | Tao | H01L 21/67167 |

FOREIGN PATENT DOCUMENTS

| | | |
|---|---|---|
| JP | 2017-041506 A | 2/2017 |
| TW | 201505117 A | 2/2015 |
| TW | 202027208 A | 7/2020 |

* cited by examiner

SUBSTRATE PROCESSING APPARATUS AND SUBSTRATE PROCESSING METHOD

CROSS REFERENCE TO RELATED APPLICATIONS

This application claims priority based on Japanese Patent Application No. 2020-145033 filed on Aug. 28, 2020, the entire disclosure of which is incorporated herein by reference.

BACKGROUND OF THE INVENTION

1. Field of the Invention

The present invention relates to an apparatus and a method for processing a substrate. Examples of substrates to be processed include semiconductor wafers, substrates for FPDs (flat panel displays) such as liquid crystal displays or organic EL (electroluminescence) displays, substrates for optical disks, substrates for magnetic disks, substrates for magneto-optical disks, substrates for photomasks, ceramic substrates, and substrates for solar cells, etc.

2. Description of the Related Art

A substrate processing apparatus that processes substrates, such as semiconductor wafers, is used in a manufacturing process of a semiconductor device. An example of such a substrate processing apparatus is disclosed by Japanese Patent Application Publication No. 2017-41506. This substrate processing apparatus includes a carrier holding portion that holds a carrier that houses a substrate, a plurality of processing units that process the substrate, a transfer unit that transfers the substrate between the carrier and the processing unit, and a control unit. When a non-use duration time of the processing unit reaches a predetermined time, a controller requests a host device to carry in a dummy carrier holding a dummy substrate. When the dummy carrier is carried into the carrier holding portion, the transfer unit transfers the dummy substrate from the dummy carrier to the processing unit. The processing unit is washed by use of the dummy substrate.

The transfer unit includes an indexer robot and a main transfer robot, and a delivery unit is disposed between these robots. The indexer robot transfers a substrate between the carrier and the delivery unit. The main transfer robot transfers a substrate between the delivery unit and the processing unit.

When the dummy carrier is placed at the carrier holding portion, the indexer robot takes a dummy substrate out of the dummy carrier, and transfers this dummy substrate to the delivery unit. This dummy substrate is transferred by the main transfer robot from the delivery unit to the processing unit. When a unit washing process using the dummy substrate is finished, the main transfer robot takes the dummy substrate out of the processing unit, and transfers the dummy substrate to the delivery unit. This dummy substrate is transferred by the indexer robot from the delivery unit to the dummy carrier. When all dummy substrates are housed in the dummy carrier, the dummy carrier is carried out of the carrier holding portion.

SUMMARY OF THE INVENTION

As thus described, the dummy substrate is introduced from the outside of the substrate processing apparatus, and is transferred to the processing unit through the same path as a product substrate, and is carried out of the processing unit, and is housed in the dummy carrier. Therefore, in order to transfer the dummy substrate, both the indexer robot and the main transfer robot are used, and the dummy substrate is transferred through the delivery unit. Therefore, interference in transfer occurs between the dummy substrate and the product substrate, and the transfer efficiency of the product substrate becomes worse, and, as a result, productivity enhancement is hindered.

Particularly in a substrate processing apparatus configured to concurrently process many product substrates by increasing the number of processing units, the indexer robot and the main transfer robot each have a large transfer load, and its reduction holds the key to productivity enhancement.

Additionally, the occupation of the carrier holding portion by the dummy carrier begins when the dummy carrier is carried therein. The occupation continues thereafter until a dummy substrate is housed in the carrier after finishing a processing operation in the processing unit which occurs after transferring the dummy substrate to the processing unit from the dummy carrier. Therefore, the carrier holding portion continues being occupied by the dummy carrier, and therefore a waiting time for the carry-in of a product substrate may occur. Therefore, likewise, from this viewpoint, productivity enhancement is hindered.

Therefore, one preferred embodiment of the present invention provides a substrate processing apparatus and a substrate processing method capable of performing a processing operation by use of a dummy substrate in a processing unit while reducing influence on the transfer of a product substrate.

One preferred embodiment of the present invention provides a substrate processing apparatus including an indexer block and a processing block that is adjacent to the indexer block in a lateral direction of the indexer block and in which a plurality of processing block layers are stacked in an up-down direction. The indexer block includes a container holding portion that holds a substrate container that houses a substrate and a first transfer mechanism that transfers a substrate between the substrate container held by the container holding portion and the processing block. Each of the processing block layers includes a plurality of processing units that perform substrate processing, a substrate placing portion that temporarily holds a substrate that is delivered between the first transfer mechanism and the processing block layer, a dummy-substrate housing portion that houses a dummy substrate that is usable in the plurality of processing units, and a second transfer mechanism that transfers a substrate between the substrate placing portion and the plurality of processing units and that transfers a dummy substrate between the dummy-substrate housing portion and the plurality of processing units.

According to this configuration, the processing block that is adjacent to the indexer block in the lateral direction of the indexer block is configured such that the plurality of processing block layers are stacked in the up-down direction. Each of the processing block layers is provided with the dummy-substrate housing portion that houses a dummy substrate. A dummy substrate can be housed in the processing block layer, and therefore it is possible to transfer the dummy substrate between the dummy-substrate housing portion and the processing unit without the participation of the first transfer mechanism when necessity to use a dummy substrate in the processing unit arises.

Therefore, it is possible to reduce the transfer load of the first transfer mechanism, and therefore it is possible to perform processing that uses a dummy substrate while reducing influence on the transfer of a product substrate. Particularly, the transfer load of the first transfer mechanism that transfers a substrate is very heavy between the plurality of processing block layers respectively having the plurality of processing units and the container holding portion. Therefore, the transfer efficiency of a product substrate is raised by reducing the transfer load of the first transfer mechanism, hence making it possible to raise productivity. The second transfer mechanism of each of the processing block layers has the job of transferring a substrate in the processing block layer, and therefore its transfer load is smaller than the first transfer mechanism. Therefore, the fact that the second transfer mechanism has the job of transferring a dummy substrate in the processing block layer does not cause a critical problem from the viewpoint of productive efficiency.

Additionally, the dummy-substrate housing portion is in the processing block layer, and therefore it is possible to transfer a dummy substrate between the dummy-substrate housing portion and the processing unit without being transferred via the substrate placing portion that is used to deliver a substrate between the first transfer mechanism and the processing block layer. Therefore, it is possible to reduce interference between the transfer of a dummy substrate and the transfer of a product substrate, and therefore it is possible to improve the transfer efficiency of the product substrate, hence making it possible to raise productivity.

Additionally, unlike the example of Japanese Patent Application Publication No. 2017-41506, the container holding portion is never occupied by the dummy carrier that houses a dummy substrate for a long time. This makes it possible to reduce an event that a waiting time occurs in order to carry in the substrate container that houses a product substrate, thus making it possible to contribute to productivity enhancement.

In one preferred embodiment of the present invention, in each processing block layer, the plurality of processing units are arranged along a transfer path along which a substrate is transferred by the second transfer mechanism on both sides of the transfer path, and are stacked in the up-down direction.

According to this configuration, the arrangement of the plurality of processing units in the processing block layers is designed so that substrates can be efficiently transferred by the second transfer mechanism. This makes it possible to contribute to productivity enhancement.

In one preferred embodiment of the present invention, the substrate placing portion is disposed between the first transfer mechanism and the second transfer mechanism, and the dummy-substrate housing portion is disposed between the first transfer mechanism and the second transfer mechanism.

According to this configuration, the substrate placing portion is disposed between the first transfer mechanism and the second transfer mechanism, hence making it possible to efficiently transfer a substrate therebetween. Additionally, the dummy-substrate housing portion is disposed between the first transfer mechanism and the second transfer mechanism, and therefore it is possible to place the dummy-substrate housing portion at a position at which the dummy-substrate housing portion does not interfere with the transfer of a substrate by the first transfer mechanism or with the transfer of a substrate by the second transfer mechanism. Therefore, it is possible to hold a dummy substrate in the processing block layer while restraining or preventing the transfer of a product substrate from being affected.

In one preferred embodiment of the present invention, the dummy-substrate housing portion is disposed at a height different from a height of the substrate placing portion. According to this configuration, it is possible to three-dimensionally dispose the dummy-substrate housing portion and the substrate placing portion, hence making it possible to appropriately dispose the dummy-substrate housing portion in the processing block layer while effectively using a space in the processing block layer. As a result, the arrangement of the dummy-substrate housing portion that does not obstruct the transfer of a product substrate is realized.

In one preferred embodiment of the present invention, the dummy-substrate housing portion is disposed so as to lie over and (partly or wholly) cover, or (partly or wholly) overlap the substrate placing portion when viewed in plan. According to this configuration, it is possible to dispose the dummy-substrate housing portion so as to overlap the substrate placing portion in a plan view while using a space above or below the substrate placing portion. This makes it possible to realize the arrangement of the dummy-substrate housing portion that does not obstruct the transfer of a product substrate, and makes it possible to dispose the dummy-substrate housing portion while effectively using a space in the processing block layer.

In detail, an arrangement in which the dummy-substrate housing portion overlaps the substrate placing portion in a plan view may be an arrangement in which part or all of a dummy substrate housed in the dummy-substrate housing portion lies over and covers, or overlaps a substrate held by the substrate placing portion.

In one preferred embodiment of the present invention, the plurality of processing block layers include a first processing block layer and a second processing block layer disposed above the first processing block layer. In the first processing block layer, the dummy-substrate housing portion is positioned below the substrate placing portion. In the second processing block layer, the dummy-substrate housing portion is positioned above the substrate placing portion.

According to this configuration, in the first processing block layer (lower layer), the dummy-substrate housing portion is positioned below the substrate placing portion, and, in the second processing block layer (upper layer), the dummy-substrate housing portion is positioned above the substrate placing portion. Therefore, it is possible to reduce a difference in height between the substrate placing portion of the first processing block layer and the substrate placing portion of the second processing block layer. As a result, it is possible to shorten a substrate transfer stroke in the up-down direction by means of the first transfer mechanism, hence making it possible to reduce the transfer load of the first transfer mechanism. Therefore, it is possible to raise the transfer efficiency of a product substrate and to contribute to productivity enhancement.

The plurality of processing block layers may have three or more processing block layers stacked in the up-down direction. In this case, the first processing block layer and the second processing block layer may be processing block layers that are adjacent to each other in the up-down direction, and may be configured such that another processing block layer is interposed therebetween.

In one preferred embodiment of the present invention, the dummy-substrate housing portion of each processing block layer includes a plurality of dummy-substrate slots that are equal in number to the plurality of processing units included in the processing block layer. Each dummy-substrate slot is configured to hold a single dummy substrate.

This configuration makes it possible to hold dummy substrates that are equal in number to the processing units in each processing block layer. Therefore, if necessity to carry a dummy substrate into any one of the processing units arises, it is possible to swiftly carry the dummy substrate into the processing unit by means of the second transfer mechanism. The first transfer mechanism does not participate in the carry-in of the dummy substrate, and therefore it is possible to restrain or prevent the transfer of a product substrate from being affected.

In one preferred embodiment of the present invention, the plurality of processing units of each processing block layer are correlated with the plurality of dummy-substrate slots of the processing block layer in a one-to-one correspondence. The second transfer mechanism transfers a dummy substrate between the dummy-substrate slot and the processing unit that correspond to each other.

According to this configuration, the plurality of dummy-substrate slots and the plurality of processing units in the processing block layer are correlated with each other in a one-to-one correspondence, and therefore it is possible to set a dummy substrate held by the dummy-substrate slot as a dummy substrate dedicated to a corresponding processing unit. As a result, the usage history of the dummy substrate is easily managed.

In one preferred embodiment of the present invention, the substrate processing apparatus further includes a controller configured (programmed) to record a usage history of a dummy substrate housed in the dummy-substrate housing portion and to issue a warning based on the usage history of the dummy substrate when the dummy substrate reaches a usage limit.

This configuration makes it possible to appropriately manage the usage situation of the dummy substrate and to issue a warning at an appropriate time. A user of the substrate processing apparatus can take countermeasures, such as dummy substrate replacement, against the warning. The dummy substrate is held in the substrate processing apparatus, hence making it possible to appropriately manage the usage situation of the dummy substrate by means of the controller included in the substrate processing apparatus.

The usage history may include the number of uses of a dummy substrate.

The controller may be communicably connected to a host computer. In this case, the controller may be configured (programmed) to transmit the warning to the host computer.

In one preferred embodiment of the present invention, the substrate processing apparatus further includes a controller configured (programmed) to control the second transfer mechanism and the processing unit. When a dummy processing condition is satisfied, the controller controls the second transfer mechanism to transfer a dummy substrate from the dummy-substrate housing portion to the processing unit, and controls the processing unit to perform dummy processing.

According to this configuration, when the dummy processing condition is satisfied, dummy processing in the processing unit is performed by the transfer of the dummy substrate in the processing block layer. Therefore, it is possible to realize dummy processing while restrain or preventing the transfer of a product substrate from being affected.

In one preferred embodiment of the present invention, the dummy processing includes a maintenance process in which maintenance of the processing unit is performed. Preferably, the maintenance process includes at least one of a preparation process in which an environment is adjusted to process a substrate (product substrate) housed in the substrate container held by the container holding portion and a unit washing process in which an inside of the processing unit is washed and cleaned.

For example, the maintenance process (e.g., unit washing process) may be performed under a dummy processing condition (maintenance execution condition, e.g., unit washing execution condition) that denotes that the number of substrates processed in the processing unit, which has been obtained by being counted, reaches a set value (or that the number of substrates processed therein exceeds a set value). Either additionally or alternatively, the maintenance process (e.g., preparation process or unit washing process) may be performed under a dummy processing condition (maintenance execution condition) that denotes that a duration time of a non-use state (non-use duration time) during which the processing unit is not used for substrate processing, which has been obtained by being measured, reaches a set value (or that a duration time of a non-use state exceeds a set value).

One preferred embodiment of the present invention provides a substrate processing method that is executed in a substrate processing apparatus including an indexer block that has a container holding portion that holds a substrate container that houses a substrate and a first transfer mechanism that transfers a substrate between the substrate container held by the container holding portion and a processing block; and the processing block that is adjacent to the indexer block in a lateral direction of the indexer block and in which a plurality of processing block layers are stacked in an up-down direction. Each processing block layer includes a plurality of processing units that perform substrate processing, a substrate placing portion that temporarily holds a substrate that is delivered between the first transfer mechanism and the processing block layer, a dummy-substrate housing portion that houses a dummy substrate that is usable in the plurality of processing units, and a second transfer mechanism that transfers a substrate between the substrate placing portion and the plurality of processing units and that transfers a dummy substrate between the dummy-substrate housing portion and the plurality of processing units. The substrate processing method allows the substrate processing apparatus to execute a dummy substrate carrying-in step in which, in each processing block layer, the second transfer mechanism carries a dummy substrate housed in the dummy-substrate housing portion in the processing block layer into any one of the plurality of processing units in the processing block layer, a dummy processing step in which dummy processing that uses the dummy substrate carried into any one of the plurality of processing units is performed in the processing unit, a step in which, after finishing the dummy processing, the second transfer mechanism takes the dummy substrate out of the processing unit, and transfers the dummy substrate to the dummy-substrate housing portion, a step in which the second transfer mechanism carries a substrate placed in the substrate placing portion of the processing block layer into any one of the plurality of processing units of the processing block layer, and a step in which the substrate carried into any one of the plurality of processing units is processed in the processing unit.

According to this method, it is possible to perform processing that uses the dummy substrate in the processing unit of each processing block layer while reducing the transfer load of the first transfer mechanism. As a result, it is possible to improve productive efficiency.

In one preferred embodiment of the present invention, the dummy substrate carrying-in step is executed in parallel with or prior to a substrate carry-in step in which the first transfer mechanism takes a substrate out of the substrate container, and carries this substrate into the substrate placing portion of one of the plurality of processing block layers.

According to this method, it is possible to allow the first transfer mechanism to carry a product substrate into the processing block layer, and, on the other hand, to carry a dummy substrate into the processing unit in each processing block layer. The first transfer mechanism is not required to participate in the carry-in of the dummy substrate, and therefore it is possible to transfer the dummy substrate in the processing block layer without waiting for the transfer of a substrate by means of the first transfer mechanism or in parallel with the transfer of the substrate. Therefore, it is possible to reduce the transfer load of the first transfer mechanism, and, in addition to this, it is possible to swiftly transfer a dummy substrate to the processing unit in the processing block layer.

In one preferred embodiment of the present invention, the dummy processing step is executed in parallel with or prior to the substrate carry-in step.

As described above, the first transfer mechanism is not required to participate in the transfer of a dummy substrate in the processing block layer, and therefore it is possible to start dummy processing in the processing unit without waiting for the transfer of a substrate by means of the first transfer mechanism or in parallel with the transfer of the substrate. Therefore, it is possible to reduce the transfer load of the first transfer mechanism, and, in addition to this, it is possible to swiftly start dummy processing in the processing block layer.

The aforementioned or yet other objects, features, and effects of the present invention will be clarified by the following description of preferred embodiments given below with reference to the accompanying drawings.

DETAILED DESCRIPTION OF THE PREFERRED EMBODIMENTS

Figure 1:
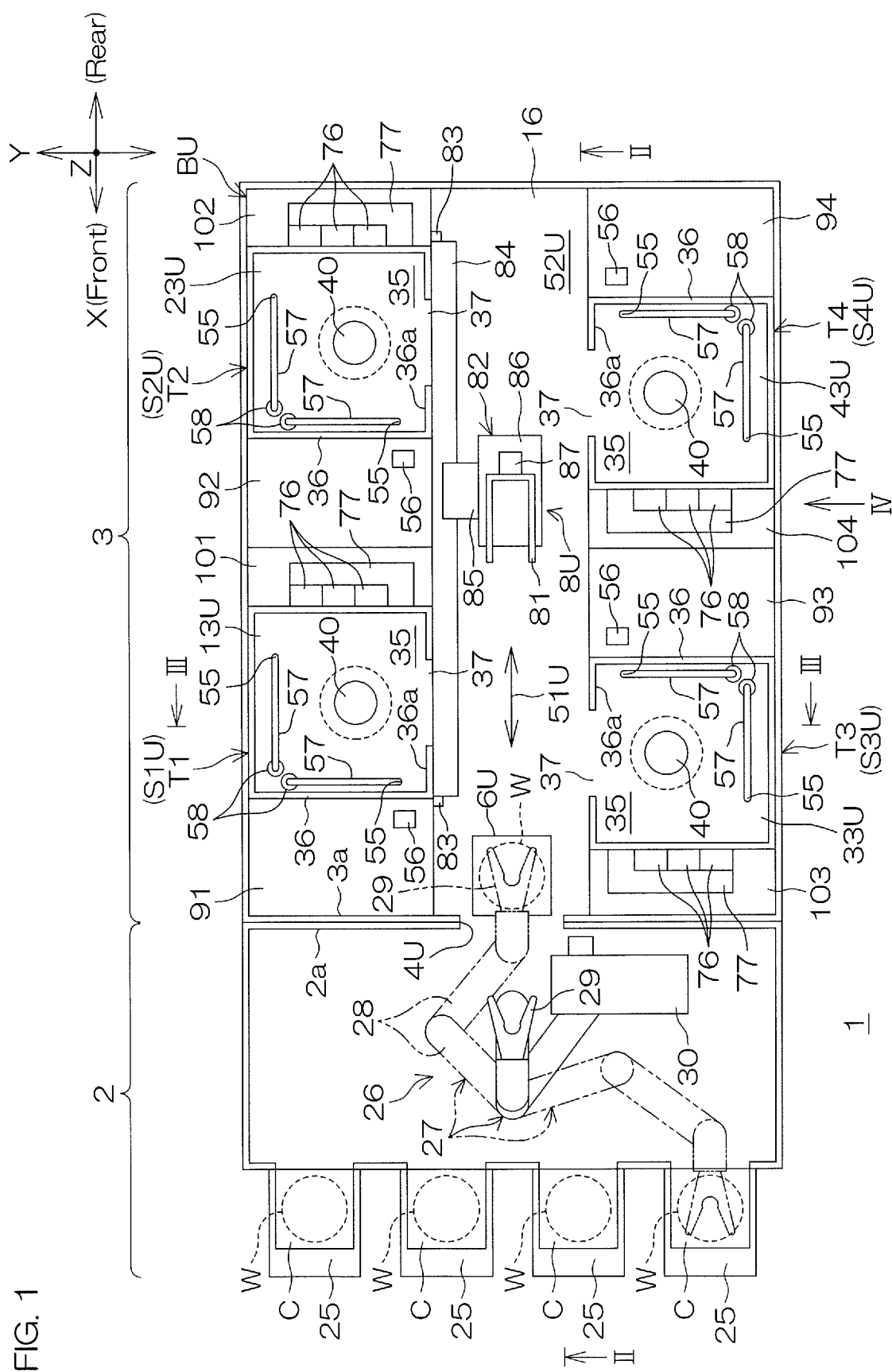
FIG. 1 is an illustrative plan view showing an internal configuration of a substrate processing apparatus according to a preferred embodiment of the present invention.
Figure 2:
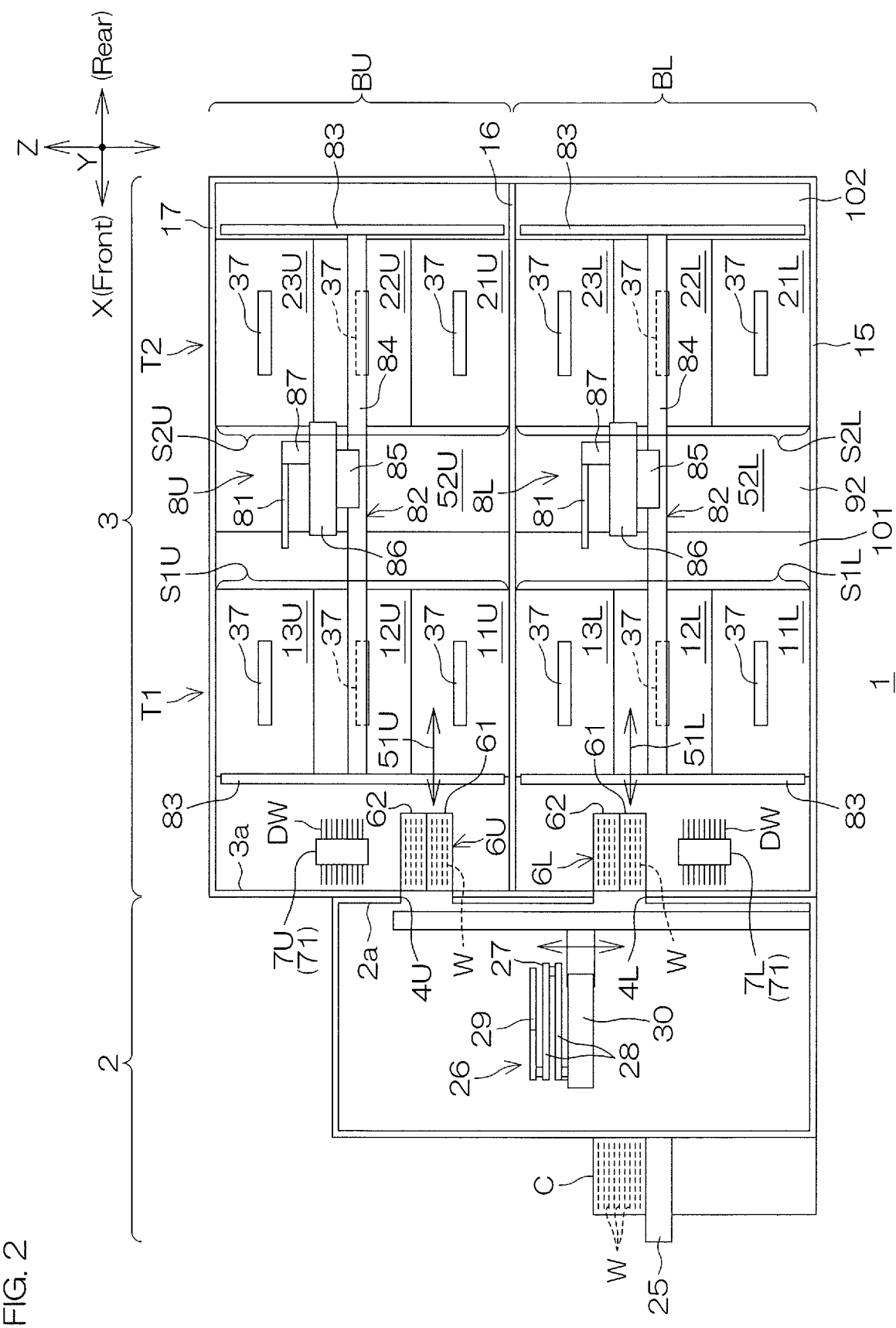
FIG. 2 is an illustrative longitudinal sectional view seen from line II-II of FIG. 1.
Figure 3:
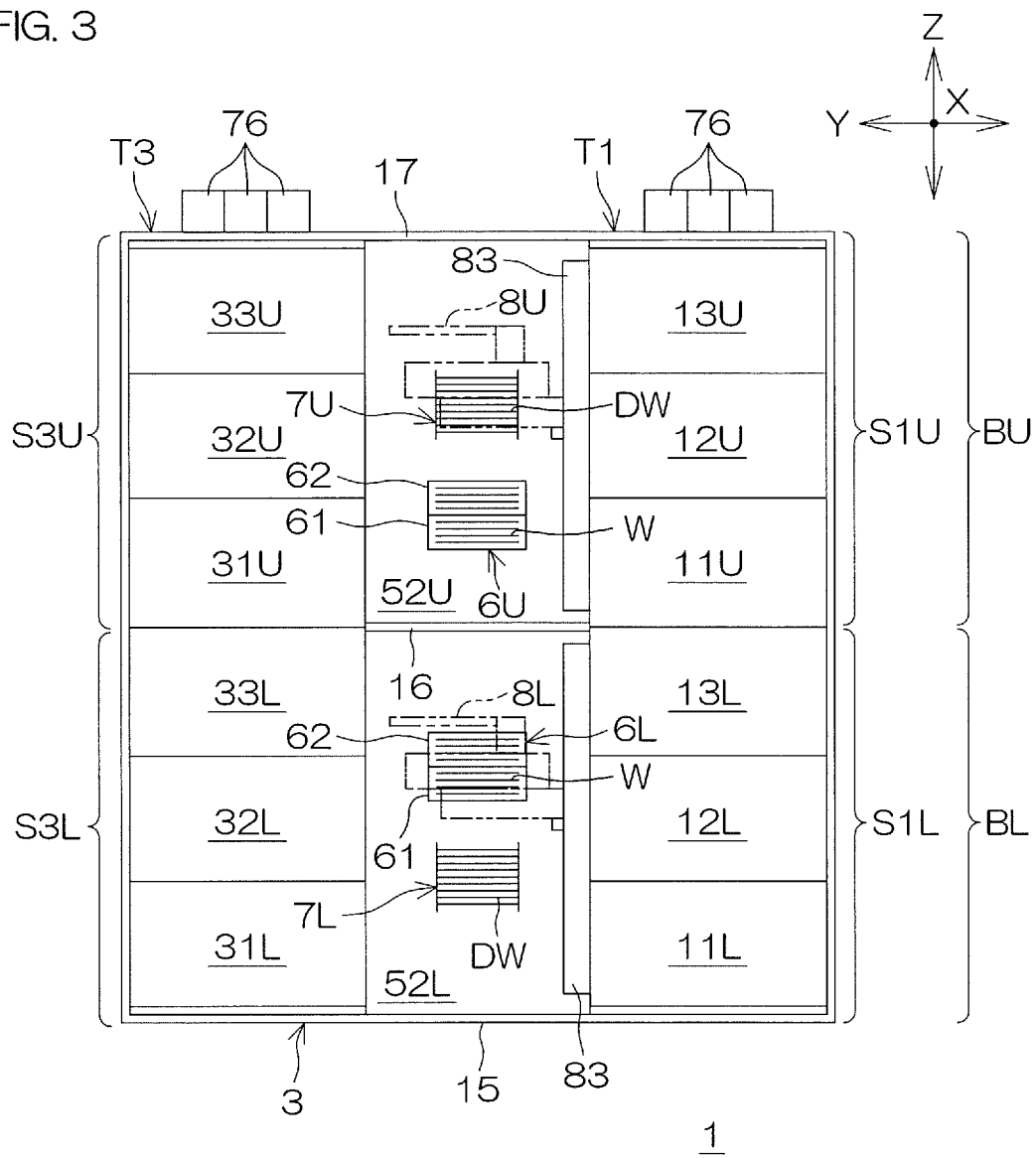
FIG. 3 is an illustrative transverse sectional view seen from line III-III of FIG. 1.
Figure 4:
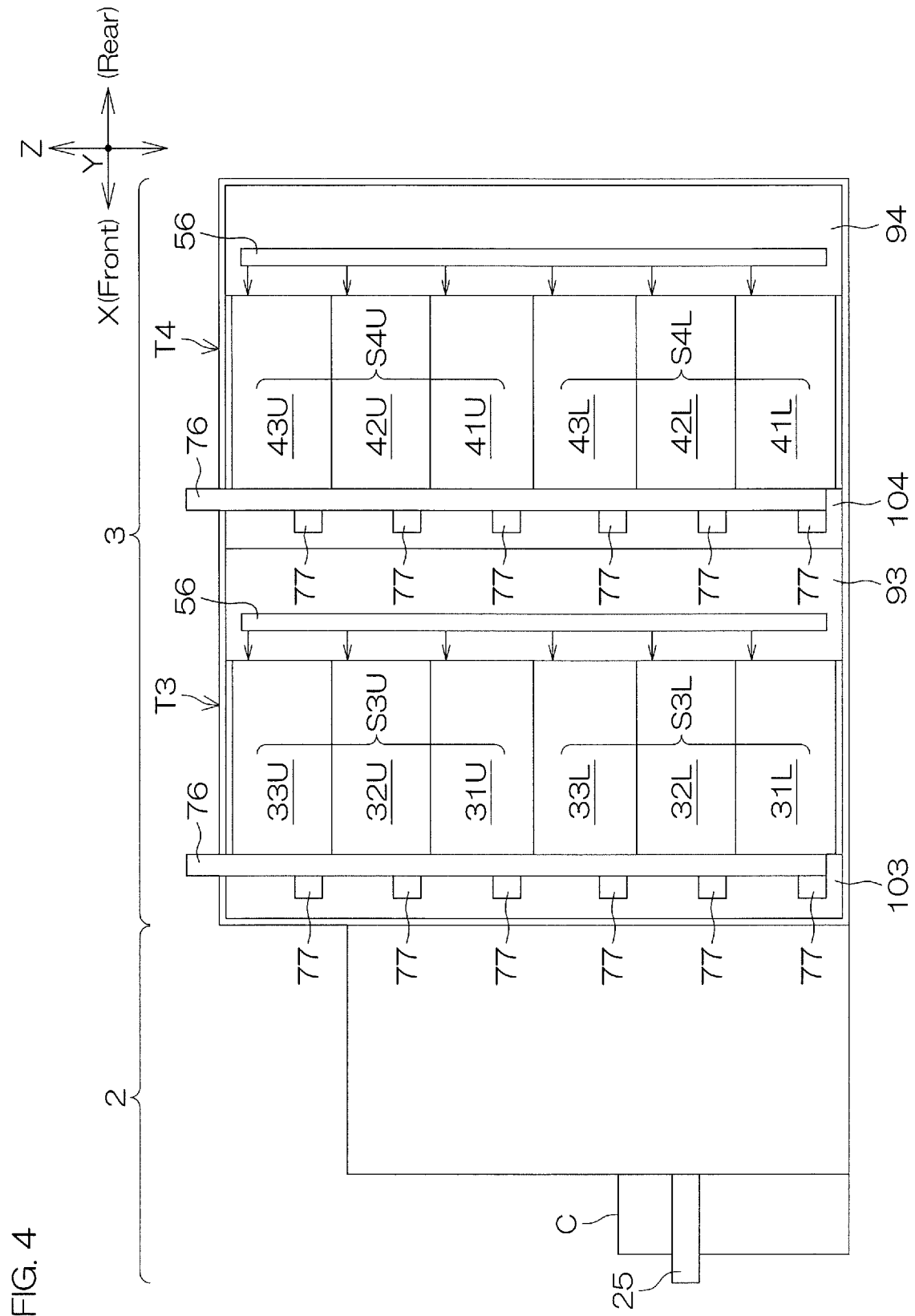
FIG. 4 is an illustrative elevational view showing an internal configuration of a processing block seen from direction IV of FIG. 1.

FIG. 1 is an illustrative plan view showing an internal configuration of a substrate processing apparatus according to a preferred embodiment of the present invention. FIG. 2 is an illustrative longitudinal sectional view seen from line II-II of FIG. 1. FIG. 3 is an illustrative transverse sectional view seen from line III-III of FIG. 1. FIG. 4 is an illustrative elevational view showing a partial internal configuration seen from direction IV of FIG. 1.

The substrate processing apparatus 1 includes an indexer block 2 and a processing block 3 adjacent to the indexer block 2 in a lateral direction (first horizontal direction X) of the indexer block 2.

The indexer block 2 includes a plurality of (in the present preferred embodiment, four) carrier holding portions (load ports) 25 and an indexer robot 26. For convenience, in some situations, the side of the carrier holding portion 25 is hereinafter defined as a front side with respect to the first horizontal direction X, and the other side opposite to the front side is hereinafter defined as a rear side with respect thereto.

The plurality of carrier holding portions 25 are arranged along a second horizontal direction Y perpendicular to the first horizontal direction X. Each of the carrier holding portions 25 is configured to accept and hold a carrier C that is automatically transferred by an automatic carrier transferring mechanism installed in a factory. Each of the carrier holding portions 25 is configured to hold a single carrier C. The carrier C is a substrate container that houses a to-be-processed substrate (product substrate) W. An example of the carrier C is a FOUP (Front Opening Unified Pod). The carrier C is configured to hold a plurality of substrates W (for example, twenty-five substrates) in a stacked state. More specifically, the carrier C is configured to hold a plurality of substrates W in a horizontal posture in a stacked state along an up-down direction Z when the carrier C is held by the carrier holding portion 25. The carrier holding portion 25 is an example of a container holding portion that holds the carrier C that is a substrate container. The substrate W is, for example, a semiconductor wafer.

The indexer robot 26 is an example of a first transferring mechanism. The indexer robot 26 is configured to access a carrier C held by each of the plurality of carrier holding portions 25, and to carry a substrate W in/out, and transfers the substrate W between the carrier holding portion 25 and the processing block 3. In the present preferred embodiment, the indexer robot 26 is an articulated-arm robot including an articulated arm 27. In detail, the indexer robot 26 includes an articulated arm 27 formed by connecting a plurality of arms 28 together, one or more hands 29 joined to a front end of the articulated arm 27, and a base portion 30 that moves upwardly and downwardly while supporting the articulated arm 27. The plurality of arms 28 and the hands 29 that are constituents of the articulated arm 27 are swingable around a perpendicular swing axis that is set at each base end portion, and are provided with individual actuators (typically, electric motors), not shown, that are used to swing each arm 28 and each hand 29.

The processing block 3 includes a plurality of processing block layers BL and BU stacked together in the up-down direction Z. In the present preferred embodiment, the processing block 3 includes a processing block layer of a first layer (lower layer) (which is hereinafter referred to as a "first processing block layer BL") and a processing block layer of a second layer (upper layer) stacked thereabove (which is hereinafter referred to as a "second processing block layer BU"). Hereinafter, when a distinction is drawn between constituents of the first processing block layer BL and constituents of the second processing block layer BU, a reference sign whose end has the letter "L" is used for the constituents of the first processing block layer BL, whereas a reference sign whose end has the letter "U" is used for the constituents of the second processing block layer BU. The same applies to reference signs of the accompanying drawings.

An internal configuration of the first processing block layer BL and an internal configuration of the second processing block layer BU in a plan view are substantially identical with each other. Therefore, it should be noted that the configuration (arrangement in a plan view) of the first processing block layer BL is represented by replacing the letter "U" of the end of a reference sign with the letter "L" and by reading it as the letter "L" in FIG. 1.

The first processing block layer BL includes a plurality of (in the present preferred embodiment, twelve) processing units 11L to 13L, 21L to 23L, 31L to 33L, and 41L to 43L (note that the processing units of the first processing block layer BL are hereinafter referred to generically as the "processing units 11L to 43L" if necessary), a substrate placing portion 6L, a dummy-substrate housing portion 7L, and a main transfer robot 8L. The plurality of processing units 11L to 43L perform an operation to process a substrate W. In the present preferred embodiment, each of the processing units 11L to 43L is a single-substrate-processing type processing unit that processes substrates W one by one. The substrate placing portion 6L is a unit that provides a temporary substrate-storage space in which a substrate W, which is delivered between the indexer robot 26 and the first processing block layer BL, is temporarily held. The dummy-substrate housing portion 7L is a unit to hold a dummy substrate DW, which can be used in the processing units 11L to 43L, inside the substrate processing apparatus 1, and provides a waiting place for the dummy substrate DW. The main transfer robot 8L is an example of a second transferring mechanism that transfers a substrate W between the substrate placing portion 6L and the processing units 11L to 43L and that transfers a dummy substrate DW between the dummy-substrate housing portion 7L and the processing units 11L to 43L.

The dummy substrate DW is a substrate that is identical with the substrate W in shape (e.g., circle) and in size. The dummy substrate DW is not used to manufacture a real product unlike a product substrate W that is supplied from the carrier C. The dummy substrate DW is introduced into and is used in the processing units 11L to 43L in order to perform preprocessing (preparation processing) in which an internal environment of the processing units 11L to 43L is adjusted, unit washing in which the inside of the processing units 11L to 43L is washed and cleaned, and so on. Processing that uses the dummy substrate DW in this way is hereinafter referred to as "dummy processing." The aforementioned preprocessing and the unit washing are a maintenance process performed to maintain the processing units 11L to 43L, and the dummy processing includes such a maintenance process.

The plurality of processing units 11L to 43L are arranged at both sides of a transfer space 52L along the transfer space 52L that provides a transfer path 51L along which a substrate W is transferred by the main transfer robot 8L, and the processing units 11L to 43L face the transfer space 52L. The transfer space 52L has a predetermined width in the second horizontal direction Y in a plan view, and rectilinearly extends in a direction away from the indexer block 2 along the first horizontal direction X. The transfer space 52L has a height substantially equal to that of the first processing block layer BL with respect to the up-down direction Z. A first liquid supply portion 91, a first processing unit stack S1L, a first exhaust portion 101, a second liquid supply portion 92, a second processing unit stack S2L, and a second exhaust portion 102 are arranged along the transfer path 51L in order of increasing distance from the indexer block 2 on one side of the transfer space 52L in a plan view. A third exhaust portion 103, a third processing unit stack S3L, a third liquid supply portion 93, a fourth exhaust portion 104, a fourth processing unit stack S4L, and a fourth liquid supply portion 94 are arranged along the transfer path 51L in order of increasing distance from the indexer block 2 on the other side of the transfer space 52L. These are arranged so as to define the transfer space 52L having a substantially rectangular parallelepiped shape.

The first to fourth processing unit stacks S1L, S2L, S3L, and S4L each include a plurality of processing units stacked together in the up-down direction Z (in the present preferred embodiment, three-stacked), i.e., the first to fourth processing unit stacks S1L, S2L, S3L, and S4L include processing units 11L to 13L, 21L to 23L, 31L to 33L, and 41L to 43L, respectively. The third processing unit stack S3L faces the first processing unit stack S1L with the transfer space 52L between the third processing unit stack S3L and the first processing unit stack S1L. The fourth processing unit stack S4L faces the second processing unit stack S2L with the transfer space 52L between the fourth processing unit stack S4L and the second processing unit stack S2L. Therefore, the plurality of processing units 31L to 33L that are constituents of the third processing unit stack S3L face the plurality of processing units 11L to 13L that are constituents of the first processing unit stack S1L with the transfer space 52L between the processing units 31L to 33L and the processing units 11L to 13L. Likewise, the plurality of processing units 41L to 43L that are constituents of the fourth processing unit stack S4L face the plurality of processing units 21L to 23L that are constituents of the second processing unit stack S2L with the transfer space 52L between the processing units 41L to 43L and the processing units 21L to 23L. In the present preferred embodiment, the first processing block layer BL includes twelve processing units 11L to 13L, 21L to 23L, 31L to 33L, and 41L to 43L, and these processing units are divided and disposed so that each of the four processing unit stacks S1L to S4L has three processing units.

The transfer space 52L is partitioned from above by means of an intermediate partition wall 16 disposed at a position coinciding with the upper surface of each of the uppermost processing units 13L, 23L, 33L, and 43L of the respective processing unit stacks S1L to S4L, and is partitioned from below by means of a lower partition wall 15 disposed at a position coinciding with the lower surface of each of the lowermost processing units 11L, 21L, 31L, and 41L. All of the processing units 11L to 43L have a substrate carry-in/out opening 37 bored at a position facing the transfer space 52L. The main transfer robot 8L transfers a substrate W and a dummy substrate DW through the transfer space 52L, and carries the substrate W and the dummy substrate DW into/from each of the processing units 11L to 43L through the substrate carry-in/out opening 37.

The substrate placing portion 6L is disposed between the indexer robot 26 and the main transfer robot 8L. More specifically, the substrate placing portion 6L is disposed at an end portion on the indexer-robot-26 side of the inside of the transfer space 52L in a plan view. In the present preferred embodiment, the substrate placing portion 6L is positioned between the first liquid supply portion 91 and the third exhaust portion 103. The substrate placing portion 6L is disposed at a height between the intermediate partition wall 16 and the lower partition wall 15 with respect to the up-down direction Z. In the present preferred embodiment, the substrate placing portion 6L is disposed so as to reach an approximately intermediate height within the height range from the intermediate partition wall 16 to an upper partition wall 17. The position in the up-down direction of the substrate placing portion 6L is required to fall within the height range accessible by the indexer robot 26 and to fall within the height range accessible by the main transfer robot 8L.

The substrate placing portion 6L includes a not-yet-processed-substrate placing portion 61 on which a not-yet-processed substrate W is placed and an already-processed-substrate placing portion 62 on which an already-processed substrate W is placed. The not-yet-processed-substrate placing portion 61 and the already-processed-substrate placing portion 62 are stacked together in the up-down direction Z. Preferably, the already-processed-substrate placing portion 62 is disposed above the not-yet-processed-substrate placing portion 61.

Figure 5:
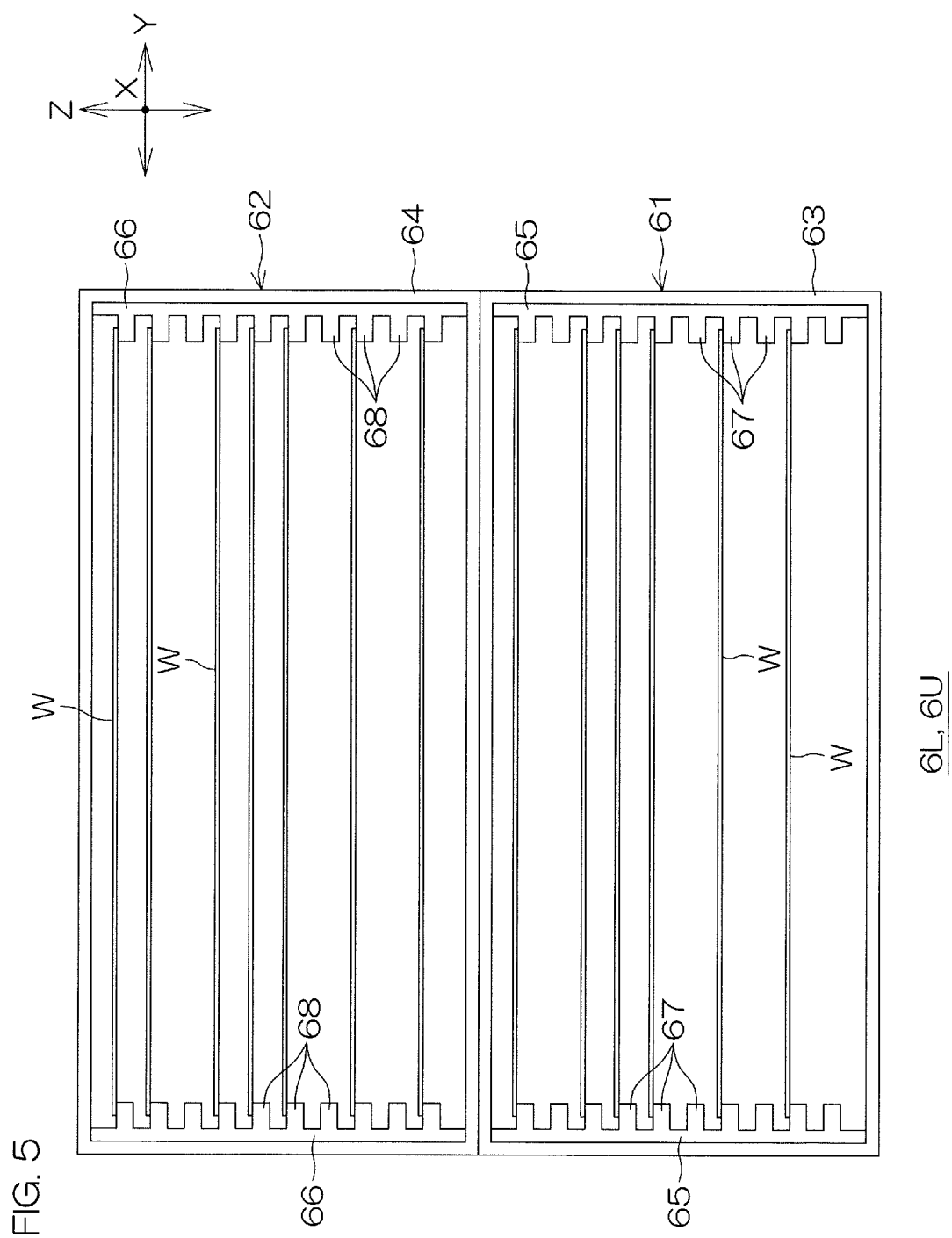
FIG. 5 is a view shown to describe a configuration example of a substrate placing portion.

As shown in an enlarged view of FIG. 5 showing a configuration example, the not-yet-processed-substrate placing portion 61 and the already-processed-substrate placing portion 62 include boxes 63 and 64 that are open both toward the indexer-robot-26 side and toward the main-transfer-robot-8L side along the first horizontal direction X and substrate holding shelves 65 and 66 disposed inside the boxes 63 and 64. The substrate holding shelves 65 and 66 have a plurality of (for example, ten) substrate support members 67 and 68 arranged in the up-down direction Z. Each of the substrate support members 67 and 68 is configured to support a peripheral edge portion of a lower surface of a single substrate W from below and to hold this substrate W in a horizontal posture. This enables the not-yet-processed-substrate placing portion 61 and the already-processed-substrate placing portion 62 to hold the plurality of substrates W (for example, ten substrates) in a state in which the substrates W are stacked together on their substrate holding shelves 65 and 66, respectively, with intervals between the substrates W in the up-down direction Z in the horizontal posture.

As shown in FIG. 2, a window 4L corresponding to the substrate placing portion 6L is formed so as to pass through a rear partition wall 2a of the indexer block 2 and a front partition wall 3a of the processing block 3, i.e., so as to pass through their adjoining partition walls. The indexer robot 26 can access the substrate placing portion 6L through the window 4L and carry a substrate W into/from the substrate placing portion 6L.

The dummy-substrate housing portion 7L is disposed at a height different from that of the substrate placing portion 6L, and, in the present preferred embodiment, is disposed below the substrate placing portion 6L in the transfer space 52L. The dummy-substrate housing portion 7L is disposed so as to overlap the substrate placing portion 6L in a plan view. More specifically, when a substrate W is held by the substrate placing portion 6L and when a dummy substrate DW is held by the dummy-substrate housing portion 7L, the dummy-substrate housing portion 7L is disposed so that the substrate W and the dummy substrate DW overlap each other in a plan view. The overlapping of the substrate W and the dummy substrate DW in a plan view may be adjusted so that these substrates lie over and partly cover each other, or may be adjusted so that these substrates lie over and wholly cover each other, i.e., so that the dummy substrate DW lies over and covers substantially the entirety of the substrate W.

The dummy-substrate housing portion 7L is disposed between the lower partition wall 15 and the intermediate partition wall 16, and is disposed in a height range that is accessible by the main transfer robot 8L. The rear partition wall 2a of the indexer block 2 and the front partition wall 3a of the processing block 3 are positioned, i.e., their adjoining partition walls are positioned on the front side of the dummy-substrate housing portion 7L, i.e., on the indexer-block-2 side. Each of these partition walls is not provided with a window corresponding to the dummy-substrate housing portion 7L. Therefore, in the present preferred embodiment, the indexer robot 26 cannot access the dummy-substrate housing portion 7L.

Figure 6:
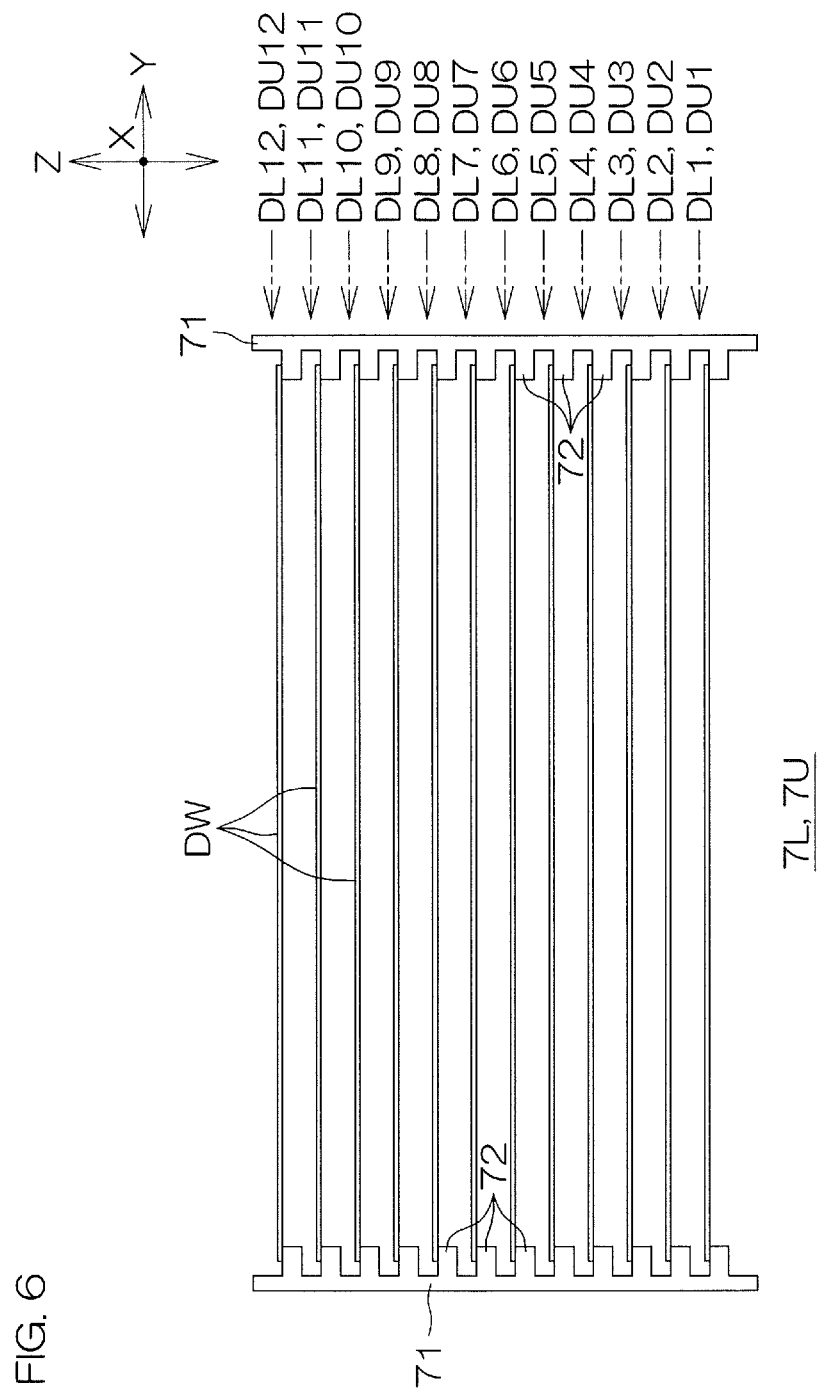
FIG. 6 is a view shown to describe a configuration example of a dummy-substrate housing portion.

As shown in an enlarged view of FIG. 6 showing a configuration example, the dummy-substrate housing portion 7L includes a dummy-substrate holding shelf 71. The configuration of the dummy-substrate holding shelf 71 may be substantially identical with those of the substrate holding shelves 65 and 66 of the substrate placing portion 6L. However, the number of dummy substrates DW that can be held by the dummy-substrate holding shelf 71 is not required to be equal to the number of substrates that can be held by the substrate holding shelves 65 and 66. In detail, the dummy-substrate holding shelf 71 has a plurality of (for example, twelve) dummy-substrate support members 72 arranged in the up-down direction. Each of the dummy-substrate support members 72 is configured to support a peripheral edge portion of a lower surface of a single dummy substrate DW from below and to hold this dummy substrate DW in a horizontal posture. The dummy-substrate housing portion 7L can hold a plurality of (for example, twelve) dummy substrates DW in a state in which the dummy substrates DW are stacked together on the dummy-substrate holding shelf 71 with intervals between the dummy substrates DW in the up-down direction Z in the horizontal posture. In detail, the dummy-substrate housing portion 7L has a plurality of slots (the number of which is identical with the number of processing units provided in the first processing block layer BL in the present preferred embodiment) stacked together in the up-down direction so as to house each dummy substrate DW in a horizontal posture (note that the slots are hereinafter referred to as "dummy-substrate slots DL1 to DL12"). A dummy-substrate sensor (not shown) may be provided for detecting the presence or absence of a dummy substrate DW in each of the dummy substrate slots DL1 to DL12. In the present preferred embodiment, the dummy-substrate housing portion 7L does not include a box that encloses dummy substrates DW housed therein, unlike the substrate placing portion 6L. Of course, such a box may be included.

As shown in FIG. 2, the main transfer robot 8L is disposed in the transfer space 52L. The main transfer robot 8L includes a hand 81 that holds a single substrate in a horizontal posture and a hand driving mechanism 82 that drives the hand 81. A plurality of (for example, two) hands may be provided. The hand driving mechanism 82 is capable of moving the hand 81 in the horizontal directions X and Y and in the up-down direction Z, and is capable of turning the hand 81 around a vertical rotational axis. The hand driving mechanism 82 includes two support pillars 83, a vertical moving portion 84, a horizontal moving portion 85, a rotational portion 86, and a proceeding/receding portion 87. The hand 81 is joined to the proceeding/receding portion 87. If a plurality of hands 81 are provided, it is preferable to provide a plurality of proceeding/receding portions 87 corresponding to those hands 81.

The two support pillars 83 are disposed with an interval between the support pillars 83 along the first horizontal direction X, and are respectively fixed to sidewalls of the transfer space 52L. The two support pillars 83 extend along the up-down direction Z, and have a function serving as rails that guide the vertical movement of the vertical moving portion 84. The vertical moving portion 84 has the form of a rail that extends in the first horizontal direction X over the two support pillars 83 and both end portions of which are joined to the two support pillars 83. The vertical moving portion 84 is configured to move in the up-down direction with respect to the support pillar 83 while being guided by the two support pillars 83. The horizontal moving portion 85 is configured to be supported on the vertical moving portion 84 and to move in the first horizontal direction X with respect to the vertical moving portion 84 while being guided by the vertical moving portion 84. The rotational portion 86 is supported by the horizontal moving portion 85. The rotational portion 86 is configured to rotate around a vertical rotational axis on the horizontal moving portion 85. The proceeding/receding portion 87 is joined to the rotational portion 86. The proceeding/receding portion 87 proceeds or recedes in the horizontal direction with respect to the rotational axis, and, as a result, the hand 81 is allowed to proceed or recede in the horizontal direction.

This configuration enables the main transfer robot 8L to deliver a substrate W between the substrate placing portion 6L and the main transfer robot 8L by allowing the hand 81 to access the substrate placing portion 6L. Additionally, this configuration enables the main transfer robot 8L to deliver a substrate W or a dummy substrate DW between an arbitrary one of the processing units 11L to 43L in the first processing block layer BL and the main transfer robot 8L by allowing the hand 81 to access the processing units 11L to 43L. Still additionally, this configuration enables the main transfer robot 8L to deliver a dummy substrate DW between the dummy-substrate housing portion 7L and the main transfer robot 8L by allowing the hand 81 to access the dummy-substrate housing portion 7L. Further, the main transfer robot 8L is enabled to transfer the substrates W, DW held by the hand 81 among the substrate placing portion 6L, the processing units 11L to 43L, and the dummy-substrate housing portion 7L in the first processing block layer BL.

The second processing block layer BU is configured in substantially the same way as the first processing block layer BL, and therefore a repeated description will be hereinafter omitted as much as possible, and differences in configuration therebetween will be chiefly described. In the second processing block layer BU, a component having the same designation as in the first processing block layer BL is configured in substantially the same way.

The second processing block layer BU includes a plurality of (in the present preferred embodiment, twelve) processing units 11U to 13U, 21U to 23U, 31U to 33U, and 41U to 43U (note that the processing units of the second processing block layer BU are hereinafter referred to generically as the "processing units 11U to 43U" if necessary), a substrate placing portion 6U, a dummy-substrate housing portion 7U, and a main transfer robot 8U. The first to fourth liquid supply portions 91 to 94 and the first to fourth exhaust portions 101 to 104 are disposed so as to extend in the up-down direction Z over the first and second processing block layers BL and BU.

The plurality of processing units 11U to 43U in the second processing block layer BU are disposed in substantially the same way as the plurality of processing units 11L to 43L in the first processing block layer BL. The second processing block layer BU includes first to fourth processing unit stacks S1U to S4U, and these first to fourth processing unit stacks S1U to S4U each include a plurality of processing units stacked together in the up-down direction Z (in the present preferred embodiment, three-stacked), i.e., the first to fourth processing unit stacks S1U, S2U, S3U, and S4U include processing units 11U to 13U, 21U to 23U, 31U to 33U, and 41U to 43U, respectively.

The first to fourth processing unit stacks S1U to S4U of the second processing block layer BU are disposed so as to overlap the first to fourth processing unit stacks S1L to S4L of the first processing block layer BL, respectively, in a plan view. The first processing unit stacks S1L and S1U of the first and second processing block layers BL and BU are stacked together in the up-down direction Z, thus forming a first tower T1 in which a plurality of processing units are stacked together (in the present preferred embodiment, six-stacked), i.e., forming a first tower T1 in which the processing units 11L, 12L, 13L, 11U, 12U, and 13U are stacked together. Likewise, the second processing unit stacks S2L and S2U of the first and second processing block layers BL and BU are stacked together in the up-down direction Z, thus forming a second tower T2 in which a plurality of processing units are stacked together (in the present preferred embodiment, six-stacked), i.e., forming a second tower T2 in which the processing units 21L, 22L, 23L, 21U, 22U, and 23U are stacked together. Additionally, the third processing unit stacks S3L and S3U of the first and second processing block layers BL and BU are stacked together in the up-down direction Z, thus forming a third tower T3 in which a plurality of processing units are stacked together (in the present preferred embodiment, six-stacked), i.e., forming a third tower T3 in which the processing units 31L, 32L, 33L, 31U, 32U, and 33U are stacked together. Additionally, likewise, the fourth processing unit stacks S4L and S4U of the first and second processing block layers BL and BU are stacked together in the up-down direction Z, thus forming a fourth tower T4 in which a plurality of processing units are stacked together (in the present preferred embodiment, six-stacked), i.e., forming a fourth tower T4 in which the processing units 41L, 42L, 43L, 41U, 42U, and 43U are stacked together.

A transfer space 52U that is defined in the second processing block layer BU and that provides a transfer path 51U overlaps the transfer space 52L of the first processing block layer BL. The transfer space 52U in the second processing block layer BU is partitioned from below by means of the intermediate partition wall 16, and is partitioned from above by means of the upper partition wall 17. The upper partition wall 17 is disposed at a height at which the upper partition wall 17 coincides with the upper surface of each of the uppermost processing units 13U, 23U, 33U, and 43U of the first to fourth towers T1 to T4.

The substrate placing portion 6U is disposed in the same way in a plan view as the substrate placing portion 6L in the first processing block layer BL. In detail, the substrate placing portion 6U is disposed between the indexer robot 26 and the main transfer robot 8U, and is disposed at an end portion on the indexer-robot-26 side in the transfer space 52U. The substrate placing portion 6U of the second processing block layer BU is disposed so as to overlap the substrate placing portion 6L of the first processing block layer BL in a plan view. The substrate placing portion 6U is disposed at a height between the intermediate partition wall 16 and the upper partition wall 17 with respect to the up-down direction Z. In the present preferred embodiment, the substrate placing portion 6U is disposed below an intermediate height within a height range from the intermediate partition wall 16 to the upper partition wall 17. More specifically, the substrate placing portion 6U is disposed at the highest position within a height range accessible by the indexer robot 26. The position in the up-down direction of the substrate placing portion 6U is required to fall within the height range accessible by the indexer robot 26 and to fall within the height range accessible by the main transfer robot 8U. The substrate placing portion 6U includes the not-yet-processed-substrate placing portion 61 on which a not-yet-processed substrate W is placed and the already-processed-substrate placing portion 62 on which an already-processed substrate W is placed in the same way as in the first processing block layer BL. The not-yet-processed-substrate placing portion 61 and the already-processed-substrate placing portion 62 are configured in the same way as the substrate placing portion 6L of the first processing block layer BL (see FIG. 5).

A window 4U corresponding to the substrate placing portion 6U is formed so as to pass through the rear partition wall 2a of the indexer block 2 and the front partition wall 3a of the processing block 3, i.e., so as to pass through their adjoining partition walls. The indexer robot 26 can access the substrate placing portion 6U through the window 4U and carry a substrate W into/from the substrate placing portion 6U.

The dummy-substrate housing portion 7U is disposed at a height different from that of the substrate placing portion 6U, and, in the present preferred embodiment, is disposed above the substrate placing portion 6U in the transfer space 52U. The dummy-substrate housing portion 7U is disposed so as to overlap the substrate placing portion 6U in a plan view. More specifically, when a substrate W is held by the substrate placing portion 6U and when a dummy substrate DW is held by the dummy-substrate housing portion 7U, the dummy-substrate housing portion 7U is disposed so that the substrate W and the dummy substrate DW overlap each other in a plan view. The overlapping of the substrate W and the dummy substrate DW in a plan view may be adjusted so that these substrates lie over and partly cover each other, or may be adjusted so that these substrates lie over and wholly cover each other, i.e., so that the dummy substrate DW lies over and covers substantially the entirety of the substrate W. The dummy-substrate housing portion 7U is disposed between the upper partition wall 17 and the intermediate partition wall 16, and is disposed in a height range that is accessible by the main transfer robot 8U. The rear partition wall 2a of the indexer block 2 and the front partition wall 3a of the processing block 3 are positioned, i.e., their adjoining partition walls are positioned on the front side of the dummy-substrate housing portion 7U, i.e., on the indexer-block-2 side. Each of these rear and front partition walls 2a and 3a is not provided with a window corresponding to the dummy-substrate housing portion 7U. Therefore, the indexer robot 26 cannot access the dummy-substrate housing portion 7U.

The configuration of the dummy-substrate housing portion 7U may be substantially identical with that of the dummy-substrate housing portion 7L of the first processing block layer BL (see FIG. 6). The dummy-substrate housing portion 7U has a plurality of slots (the number of which is identical with the number of processing units provided in the second processing block layer BU in the present preferred embodiment) stacked together in the up-down direction so as to house each dummy substrate DW in a horizontal posture (note that the slots are hereinafter referred to as "dummy-substrate slots DU1 to DU12"). A dummy-substrate sensor may be provided for detecting the presence or absence of a dummy substrate DW in each of the dummy substrate slots DU1 to DU12.

The main transfer robot 8U is disposed in the transfer space 52U. The main transfer robot 8U includes the hand 81 that holds a single substrate in a horizontal posture and the hand driving mechanism 82 that drives the hand 81. The hand driving mechanism 82 includes the two support pillars 83, the vertical moving portion 84, the horizontal moving portion 85, the rotational portion 86, and the proceeding/receding portion 87. These are configured in the same way as in the main transfer robot 8L of the first processing block layer BL.

The liquid supply portions 91 to 94 define a liquid pipe space that houses pipes that supply a processing liquid used in the processing units 11L to 43L; 11U to 43U. The liquid pipe space defined by each of the liquid supply portions 91 to 94 passes through the first processing block layer BL and the second processing block layer BU in the up-down direction Z. A processing liquid pipe 56 that supplies a processing liquid to six processing units 11L, 12L, 13L, 11U, 12U, 13U; 21L, 22L, 23L, 21U, 22U, 23U; 31L, 32L, 33L, 31U, 32U, 33U; 41L, 42L, 43L, 41U, 42U, 43U that are stacked together in the up-down direction Z in a six-stacked state at the same position in a plan view and that form the towers T1 to T4 is housed in each of the liquid supply portions 91 to 94. Processing-liquid-related equipment, such as valves, a flowmeter, a tank in which a processing liquid is temporarily stored, or a liquid sending pump, that is disposed at a position between both ends of the pipe, may be additionally housed in the liquid supply portions 91 to 94.

The exhaust portions 101 to 104 define an exhaust pipe space that houses pipes through which the atmosphere of the inside of the processing unit is discharged. The exhaust pipe space defined by each of the exhaust portions 101 to 104 passes through the first processing block layer BL and the second processing block layer BU in the up-down direction Z. An exhaust pipe 76 that guides exhaust gas, which is sent from six processing units 11L, 12L, 13L, 11U, 12U, 13U; 21L, 22L, 23L, 21U, 22U, 23U; 31L, 32L, 33L, 31U, 32U, 33U; 41L, 42L, 43L, 41U, 42U, 43U that are stacked together in the up-down direction Z in a six-stacked state at the same position in a plan view and that form the towers T1 to T4, to exhaust equipment placed outside the substrate processing apparatus 1 is housed in each of the exhaust portions 101 to 104. A switching mechanism 77 that switches the exhaust pipe 76 in accordance with the kind of processing in the processing unit (more specifically, in accordance with the kind of a processing liquid) may be additionally housed in the exhaust portions 101 to 104. The exhaust portion 101 includes actuators (not shown) that drive the switching mechanism 77.

Figure 7:
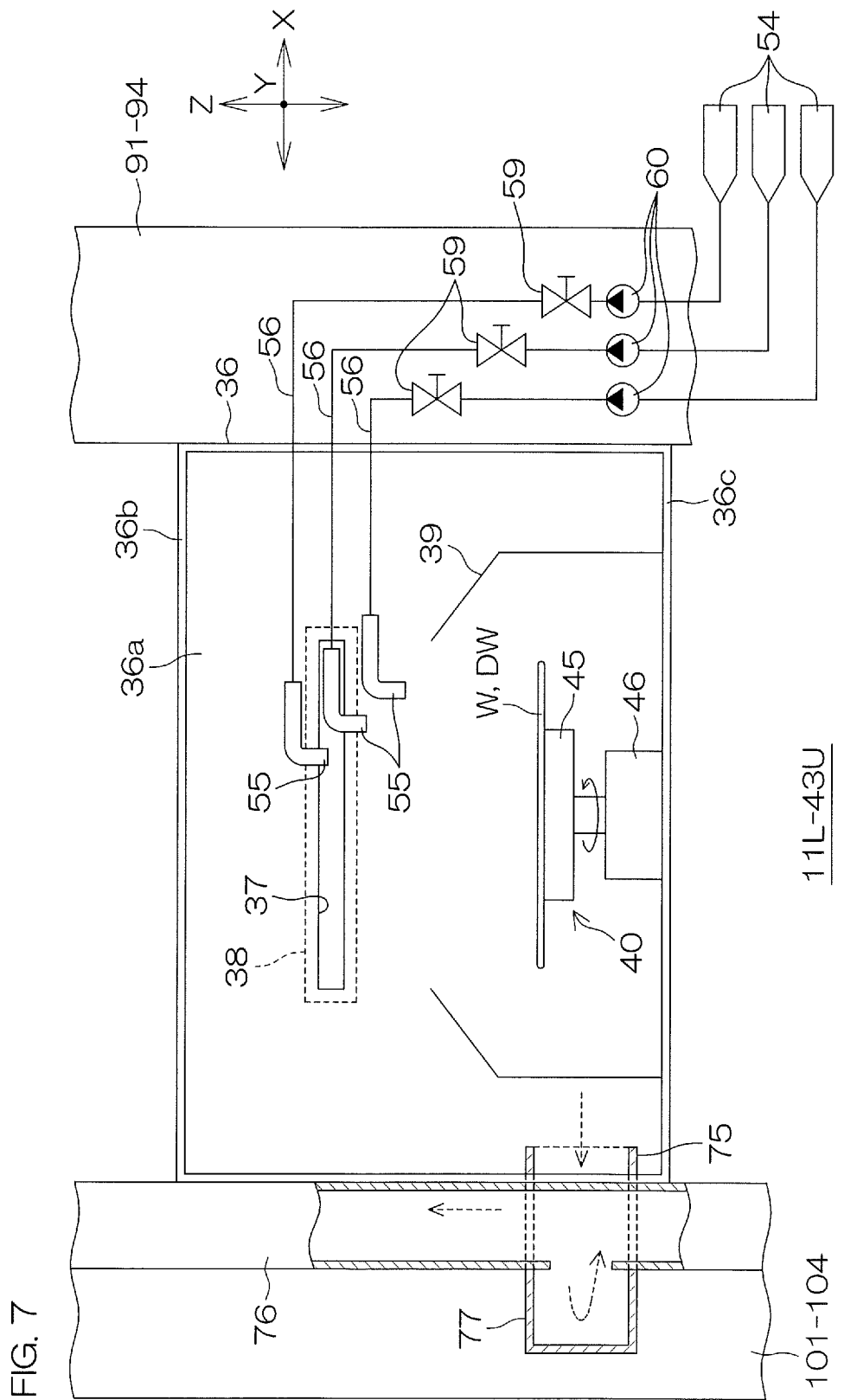
FIG. 7 is an illustrative cross-sectional view shown to describe a configuration example of a processing unit.

FIG. 7 is an illustrative cross-sectional view shown to describe a configuration example of the processing units 11L to 43L; 11U to 43U (which are hereinafter referred to generically as the "processing units 11L to 43U" if necessary). Each of the processing units 11L to 43U includes a unit partition wall 36 that defines a processing chamber 35 (chamber), a processing cup 39 disposed in the unit partition wall 36, a spin chuck 40 disposed in the processing cup 39, and a nozzle 55 that supplies a processing liquid to a substrate W or DW held by the spin chuck 40.

The unit partition wall 36 includes, for example, a sidewall 36a formed in a substantially rectangular shape, a ceiling wall 36b that partitions an upper side, and a bottom wall 36c that partitions a lower side in a plan view. One surface of the sidewall 36a extends along the first horizontal direction X and the up-down direction Z while facing the transfer space 52U, and has a substrate carry-in/out opening 37 through which a substrate W or DW is carried in or out.

The substrate carry-in/out opening 37 may have a slot shape that extends in the first horizontal direction X. A shutter 38 formed to open and close the substrate carry-in/out opening 37 is disposed. The substrate W or DW is carried in from the substrate carry-in/out opening 37 formed in the unit partition wall 36, and is delivered to the spin chuck 40.

The spin chuck 40 includes a spin base 45 that holds a single substrate W or DW in a horizontal posture and a spin motor 46 that rotates the spin base 45 around a vertical rotational axis. The spin chuck 40 may be a vacuum type spin chuck that holds the substrate W or DW while allowing the upper surface of the spin base 45 to suck the lower surface of the substrate W or DW. Additionally, the spin base 45 may be configured as a mechanical-type chuck having a circular planar shape corresponding to the substrate W or DW. Such a mechanical-type chuck includes three or more holding pins disposed at its peripheral edge portion with intervals between the holding pins in a circumferential direction, and is configured to grip the substrate W or DW by means of those holding pins.

The processing units 11L to 43U include one or more nozzles 55 that supply a processing liquid to a substrate W or DW held by the spin chuck 40. In the present preferred embodiment, a plurality of nozzles 55 are provided. These plurality of nozzles 55 may include a plurality of chemical liquid nozzles that are respectively used to discharge a plurality of kinds of chemical liquids.

A processing liquid is supplied from the nozzle 55 to the front surface of the substrate W or DW held and rotated by the spin chuck 40. The nozzle 55 is joined to the processing liquid pipe 56 disposed through the liquid supply portions 91 to 94. The processing liquid pipe 56 is drawn around through the liquid supply portions 91 to 94, and is connected to a processing liquid supply source 54. A valve 59 that opens and closes the flow passage of the processing liquid pipe 56 is interposed between both ends of the processing liquid pipe 56. Additionally, a pump 60 that is used to send a processing liquid toward the nozzle 55 is interposed between both ends of the processing liquid pipe 56. The valve 59 and the pump 60 are disposed at the liquid supply portions 91 to 94. The processing liquid supply source 54 supplies a chemical liquid, such as an etching liquid, and a rinse liquid, such as DIW (deionized water). A plurality of processing liquid pipes 56 and a plurality of corresponding nozzles 55 may be disposed in accordance with the kind of the processing liquid. Part or all of the plurality of nozzles 55 may have the form of a moving nozzle that moves along the upper surface of a substrate W or DW above the substrate W or DW. The moving nozzle may have a structure in which a base end portion of a horizontal nozzle arm 57 is supported by a rotary shaft 58 extending vertically and disposed beside the spin chuck and in which the rotary shaft 58 is turned around a vertical axis (see FIG. 1). Part or all of the plurality of nozzles 55 may be a stationary nozzle whose relative position with respect to the spin chuck 40 is fixed.

An atmosphere in the unit partition wall 36 is discharged through an exhaust connection pipe 75 that passes through the unit partition wall 36. The exhaust connection pipe 75 is connected to the exhaust pipe 76 disposed at the exhaust portions 101 to 104. The exhaust connection pipe 75 may be connected to a plurality of exhaust pipes 76 through the switching mechanism 77. In accordance with, for example, the kind of a processing liquid discharged from the plurality nozzles 55 (for example, the kind of a chemical liquid), the switching mechanism 77 operates to guide an exhaust gas sent from the exhaust connection pipe 75 to the exhaust pipe 76 pre-correlated with the kind of the processing liquid.

Figure 8:
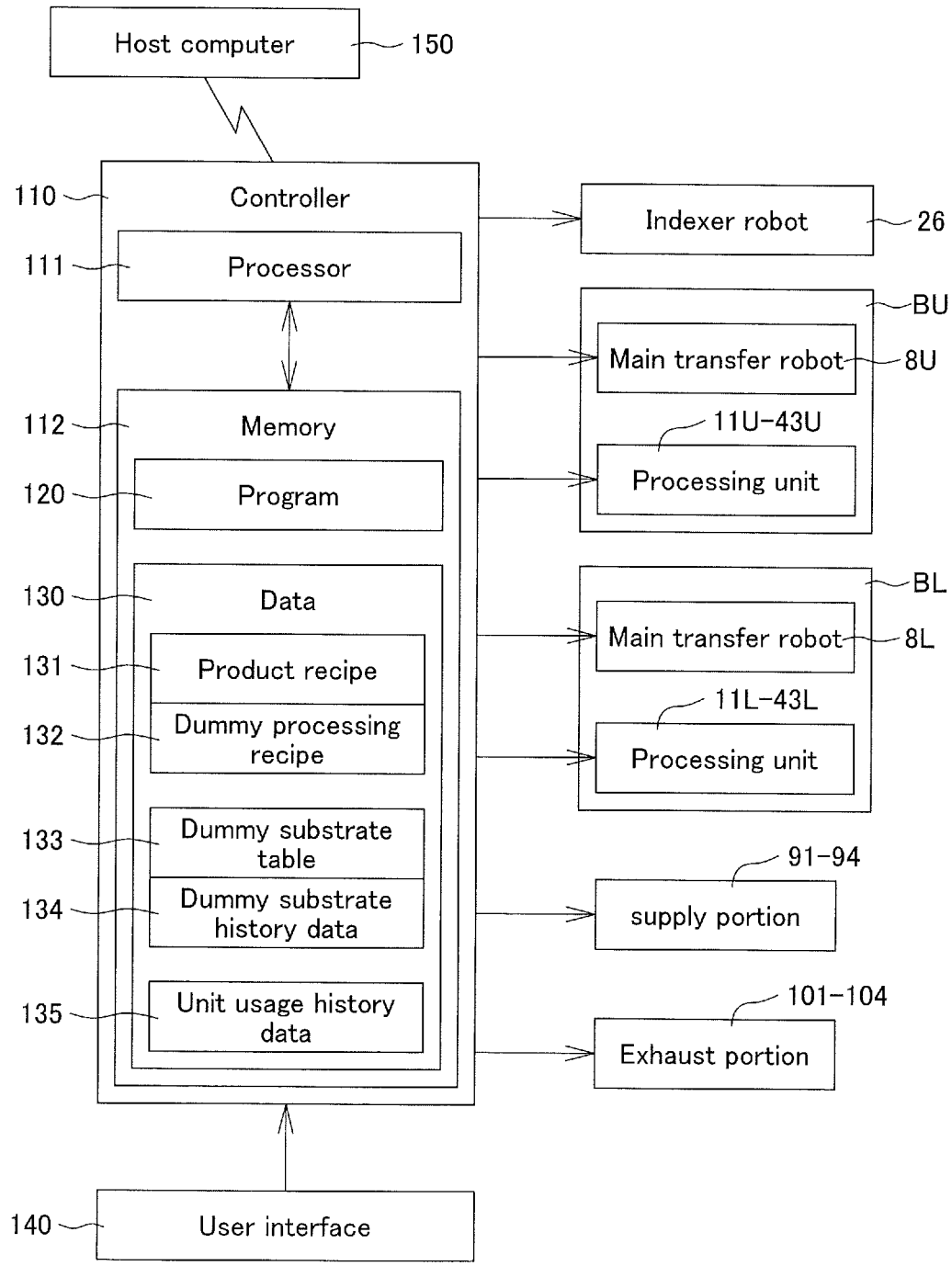
FIG. 8 is a block diagram shown to describe a configuration relative to the control of the substrate processing apparatus.

FIG. 8 is a block diagram shown to describe a configuration relative to the control of the substrate processing apparatus 1. The substrate processing apparatus 1 includes a controller 110. The controller 110 may be a computer including a processor 111 (CPU) and a memory 112. The processor 111 executes a program 120 stored in the memory 112. This enables the controller 110 to fulfill a substrate transferring operation that transfers a substrate W or DW by means of the indexer robot 26 and the main transfer robots 8L and 8U, a substrate processing operation that processes a substrate W by means of the processing units 11L to 43U, and a dummy processing operation that performs dummy processing that uses a dummy substrate DW in the processing units 11L to 43U. For these operations, the controller 110 controls various to-be-controlled components included in the substrate processing apparatus 1. The to-be-controlled components include a driving portion that is included in the indexer robot 26, in the main transfer robots 8L and 8U, in the processing units 11L to 43U, and so on. Additionally, the to-be-controlled components of the controller 110 include the valve 59 and a pump 69 disposed at the liquid supply portions 91 to 94, and include actuators disposed at the exhaust portions 101 to 104.

Various data 130 are stored in the memory 112. The data 130 include a product recipe 131 for processing a product substrate W, which is a substrate used for a product, and a dummy processing recipe 132 for performing dummy processing that uses a dummy substrate DW. The product recipe 131 is data to prescribe the operation of transferring a substrate W and the content of processing applied onto the substrate W. The dummy processing recipe 132 is data to prescribe the operation of transferring a dummy substrate DW and the content of processing performed by use of the dummy substrate DW. The controller 110 controls a to-be-controlled component in accordance with the product recipe 131 when the substrate W is processed, whereas the controller 110 controls a to-be-controlled component in accordance with the dummy processing recipe 132 when dummy processing is performed.

The product recipe 131 may be given by data communication from a host computer 150 communicably connected to the controller 110, and may be stored in the memory 112. Likewise, the dummy processing recipe 132 may be given by communication from the host computer 150, and may be stored in the memory 112. Additionally, an operator may input or edit the product recipe 131 and the dummy processing recipe 132 by use of a user interface 140 connected to the controller 110. The dummy processing recipe 132 may be automatically generated by the controller 110 in accordance with the contents of the product recipe 131. The product recipe 131 and the dummy processing recipe 132 are not required to be each limited to one kind of recipe, and a plurality of product recipes 131 or a plurality of dummy processing recipes 132 may be stored in the memory 112.

For example, the dummy processing recipe 132 includes a preprocessing recipe that prescribes preprocessing in which the same processing as in the product substrate W is applied onto the dummy substrate DW. The preprocessing recipe may be a recipe identical to the product recipe 131 except that a substrate carried into the processing units 11L to 43U is a dummy substrate DW instead of a product substrate W. The thus formed preprocessing recipe may be automatically generated by the controller 110 on the basis of the product recipe 131. For example, if processing that supplies a high-temperature processing liquid to a substrate W is applied, it becomes possible to guide the high-temperature processing liquid to the nozzle 55 by performing preprocessing, and it is possible to heat the inside of the processing liquid pipe 56 and the inside of the processing units 11L to 43U by means of the high-temperature processing liquid. As a result, it is possible to supply a processing liquid having an appropriate temperature to the product substrate W in an environment in which thermal management is appropriately performed. As thus described, the preprocessing is an example of preparation processing that adjusts a processing environment for the processing units 11L to 43U in order to appropriately process the product substrate W.

Additionally, the dummy processing recipe 132 includes a unit washing recipe for washing the inside of the processing units 11L to 43U while allowing the spin chuck 40 to hold a dummy substrate DW. In a unit washing process performed in accordance with the unit washing recipe, the dummy substrate DW is rotated while being held by the spin chuck 40, and, in this state, a washing liquid (chemical liquid or DIW) is supplied to the dummy substrate DW. As a result, the washing liquid that has received a centrifugal force on the dummy substrate DW is scattered around the spin chuck 40, and washes the inside of the processing cup 39. The incident position of the washing liquid with respect to the inner wall surface of the processing cup 39 is changed upwardly or downwardly by moving the processing cup 39 upwardly or downwardly when necessary, and therefore it is possible to efficiently wash the inner wall surface of the processing cup 39. Additionally, the upward or downward movement of the processing cup 39 or of the spin chuck 40 makes it possible to place the dummy substrate DW at a higher position than an upper end of the processing cup 39, and makes it possible to supply the washing liquid to the inside of the processing chamber 35 outside the processing cup 39, and makes it possible to wash the inside of the processing chamber 35.

The data 130 stored in the memory 112 additionally include a dummy substrate table 133 that correlates the plurality of processing units 11L to 43U with the dummy-substrate slots DL1 to DL12 and DU1 to DU12 of the dummy-substrate housing portions 7L and 7U. Unique dummy-substrate slot numbers (dummy-substrate slot identification information) are given to the plurality of dummy-substrate slots DL1 to DL12 and DU1 to DU12, respectively. Additionally, a single dummy-substrate slot number is correlated with each of the processing units 11L to 43U. The dummy substrate table 133 correlates the plurality of processing units 11L to 43L (in the present preferred embodiment, twelve) of the first processing block layer BL with the plurality of dummy-substrate slot numbers (in the present preferred embodiment, twelve) of the dummy-substrate housing portion 7L of the first processing block layer BL in a one-to-one correspondence. Additionally, the dummy substrate table 133 correlates the plurality of processing units 11U to 43U (in the present preferred embodiment, twelve) of the second processing block layer BU with the plurality of dummy-substrate slot numbers (in the present preferred embodiment, twelve) of the dummy-substrate housing portion 7U of the second processing block layer BU in a one-to-one correspondence. Therefore, the dummy substrate table 133 correlates the plurality of processing units 11L to 43U (in the present preferred embodiment, twenty-four) of the substrate processing apparatus 1 with the plurality of slot numbers (in the present preferred embodiment, twenty-four) of the dummy-substrate housing portions 7L and 7U in a one-to-one correspondence.

The data 130 stored in the memory 112 additionally include dummy substrate history data 134. The dummy substrate history data 134 include data that show a usage history of a dummy substrate DW housed in the dummy-substrate slots DL1 to DL12 and DU1 to DU12 that correspond to the plurality of dummy-substrate slot numbers of the dummy-substrate housing portions 7L and 7U, respectively. Preferably, the usage history includes at least one of the number of uses (cumulative number of times) at which the dummy substrate DW has been used for processing in the processing units 11L to 43U, used hours (cumulative time) during which the dummy substrate DW has been used for processing in the processing units 11L to 43U, and the history of processing that has been applied to the dummy substrate DW in the processing units 11L to 43U.

The data 130 stored in the memory 112 additionally include unit usage history data 135 that show a unit usage history of each of the processing units 11L to 43U. Preferably, the unit usage history data 135 include the number of substrates processed of each of the processing units 11L to 43U and non-use duration time that shows continuous time during which each of the processing units 11L to 43U is not used for substrate processing. An environment in the processing units 11L to 43U is gradually worsened by repeatedly performing substrate processing, and therefore it is preferable to set an appropriate upper limit on the number of substrates that can be consecutively processed without requiring maintenance. Additionally, the environment in the processing units 11L to 43U is gradually deteriorated if a period of time during which substrates W have not been processed becomes long. In detail, there is a case in which a chemical liquid that has adhered to the inner wall of the processing cup 39 or to other parts is dried, and is crystallized, and hence causes particles. Additionally, when a processing liquid whose temperature is higher than room temperature is used, the temperature of the processing liquid pipe 56 or of the nozzle 55 will fall if the flow of the processing liquid is stopped for a long time because of the continuance of a non-use state. Therefore, there is a possibility that, when the processing liquid is discharged next time, the processing liquid pipe 56 or the nozzle 55 will draw heat from the processing liquid, and the temperature of the processing liquid immediately after discharge of the processing liquid will become inappropriate. Therefore, likewise, it is preferable to set an appropriate upper limit on the non-use duration time. A comparison is made between the unit usage history data 135 (the number of substrates processed, the non-use duration time, etc.) and corresponding set values, thus making it possible to determine whether the maintenance of the processing units 11L to 43U is required or not.

Figure 9:
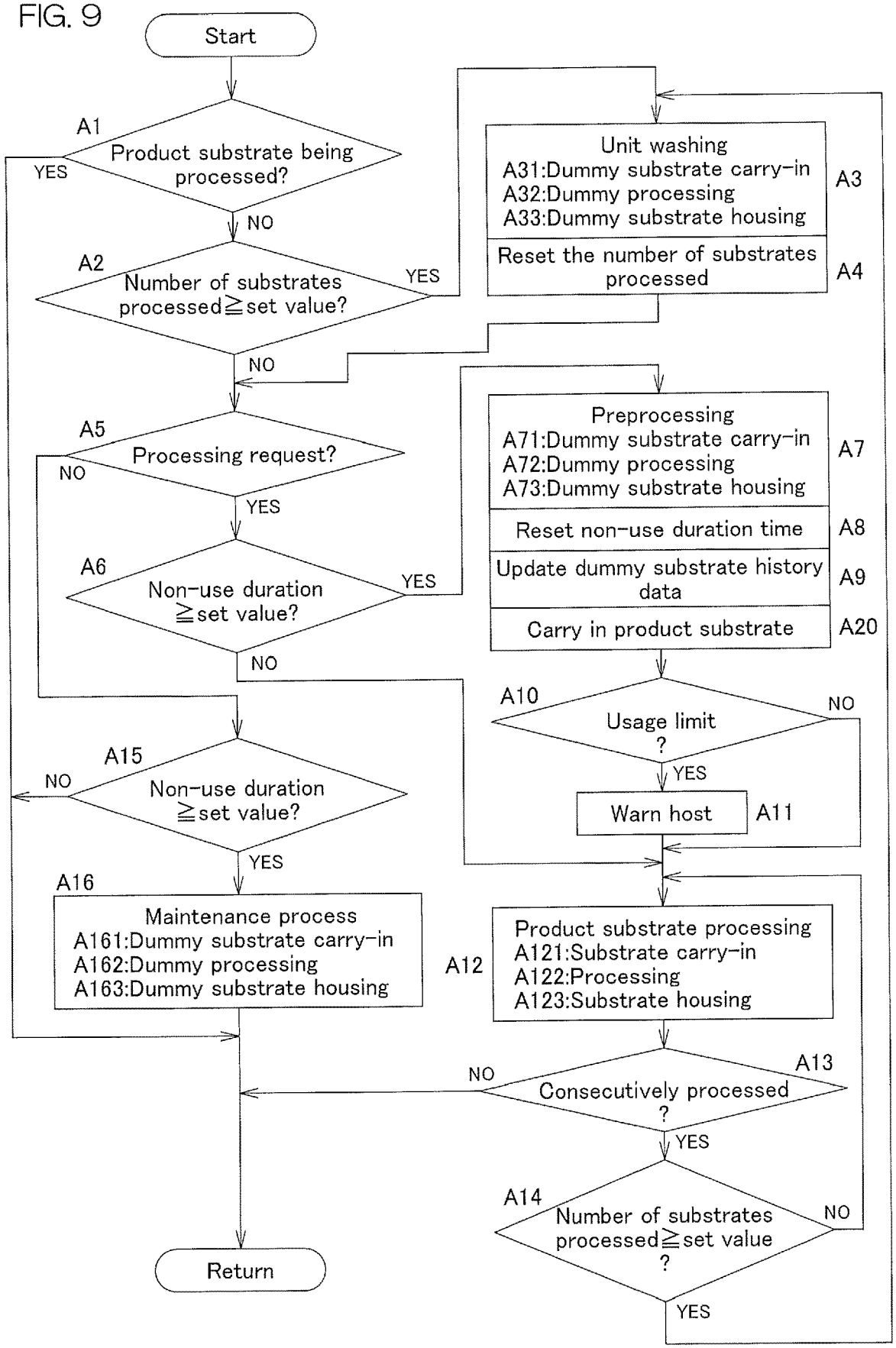
FIG. 9 is a flowchart shown to describe the operation of a controller relative to dummy processing.

FIG. 9 is a flowchart shown to describe the operation of the controller 110 relative to dummy processing. The controller 110 performs process steps shown in FIG. 9 in parallel or in order with respect to each of the plurality of processing units 11L to 43U.

The controller 110 determines whether a product substrate W is being processed in a targeted one of the processing units 11L to 43U (step A1). If the substrate W has finished being processed in the processing units 11L to 43U, and if this already-processed substrate W is carried out from the processing units 11L to 43U (step A1: NO), the controller 110 refers to the unit usage history data 135 of the targeted one of the processing units 11L to 43U, and determines whether the number of substrates that have been processed has reached the set value (step A2). If the number of substrates processed is equal to or more than the set value (step A2: YES), the controller 110 determines that a unit washing execution condition (one example of the maintenance execution condition) has been satisfied, and performs a unit washing process (one example of the maintenance process) in accordance with the unit washing recipe in order to wash the inside of the processing units 11L to 43U (step A3). Furthermore, the controller 110 resets the number of substrates processed of the processing unit at an initial value (for example, 0), and updates the unit usage history data 135 (step A4).

The unit washing process is one example of the dummy processing, and includes a dummy substrate carry-in step A31, a dummy processing step A32, and a dummy substrate housing step A33. The dummy substrate carry-in step A31 is a step in which the main transfer robots 8L and 8U carry a dummy substrate DW out of a corresponding one of the dummy-substrate slots DL1 to DL12, DU1 to DU12, and transfer this dummy substrate DW to the processing units 11L to 43U, and carry this dummy substrate DW into the corresponding processing unit. The dummy processing step A32 is a step in which processing that uses a dummy substrate DW is performed in the processing unit, and, here, it is a washing step in which the inside of the processing unit is washed. The dummy substrate housing step A33 is a step in which a dummy substrate DW is carried out of the processing unit after washing the inside of the processing unit, and is transferred to the original dummy-substrate slots DL1 to DL12 and DU1 to DU12, and is housed therein. The controller 110 refers to the dummy substrate table 133, and identifies the dummy-substrate slots DL1 to DL12 and DU1 to DU12 corresponding to the processing units 11L to 43U, and performs the dummy substrate carry-in step A31 and the dummy substrate housing step A33.

When the unit washing process is finished, the controller 110 determines whether preprocessing for adjusting a processing environment (processing condition) of the processing units 11L to 43U is required or not (steps A5 and A6). In detail, the controller 110 examines whether a processing request (processing reservation) for a product substrate has been given from the host computer 150 (step A5). If the processing request for the product substrate has been given (step A5: YES), the controller 110 determines whether the non-use duration time of the processing units 11L to 43U has reached the set value (step A6). If the non-use duration time is equal to or exceeds the set value (step A6: YES), i.e., if the processing units 11L to 43U have not been used for the product substrate W during a period exceeding a predetermined long time, the controller 110 determines that preprocessing is required, i.e., that the preprocessing execution condition (one example of the maintenance execution conditions) has been satisfied.

If it is determined that preprocessing is required, the controller 110 performs preprocessing in accordance with the preprocessing recipe (step A7). In detail, the controller 110 refers to the dummy substrate table 133, and identifies the dummy-substrate slots DL1 to DL12 and DU1 to DU12 corresponding to the processing units 11L to 43U. Thereafter, the controller 110 allows the main transfer robots 8L and 8U to carry a dummy substrate DW out of the dummy-substrate slot identified by the controller 110 and to transfer the dummy substrate DW to the processing units 11L to 43U while controlling the main transfer robots 8L and 8U (dummy substrate carry-in step A71). After transferring the dummy substrate DW thereto, the host computer 150 applies the same processing onto the dummy substrate DW as onto the product substrate W in the processing units 11L to 43U (dummy processing step A72). When this processing is finished, the host computer 150 allows the main transfer robots 8L and 8U to take the dummy substrate DW out of the processing units 11L to 43U, and to transfer this dummy substrate DW to the original dummy-substrate slot, and to house the dummy substrate DW in this dummy-substrate slot while controlling the main transfer robots 8L and 8U (dummy substrate housing step A73). When the preprocessing is performed in this way, the controller 110 resets the non-use duration time at an initial value (for example, 0) (step A8), and updates the unit usage history data 135 (step A9).

The controller 110 performs preprocessing at the time a processing request for a product substrate W (processing reservation) is given as described above. The preprocessing includes the transfer of a dummy substrate DW (step A71) and the performance of dummy processing that uses the dummy substrate DW (step A72). Therefore, the preprocessing (the dummy substrate carry-in step A71 and/or the dummy processing step A72) is performed in parallel with or prior to a substrate carrying-in operation (step A20) in which a carrier C that has housed a product substrate W is held by the carrier holding portion 25 and in which the indexer robot 26 takes a to-be-processed substrate W out of the carrier C and transfers this substrate W to the substrate placing portions 6L and 6U. At this time, the indexer robot 26 does not participate in the transfer of the dummy substrate DW. Therefore, the dummy substrate DW is transferred inside the processing block 3, and the preprocessing is performed without obstructing the transfer of the product substrate W by means of the indexer robot 26.

Although the carry-in step A20 of the product substrate W by means of the indexer robot 26 is shown in FIG. 9 for convenience, this does not denote that a before-after relationship with respect to the preprocessing step A7 is established as shown in FIG. 9. The product substrate carry-in step A20 can be performed (can be started), as described above, prior to or in parallel with the preprocessing step A7. Additionally, the product substrate carry-in step A20 can also be performed (can also be started) after the preprocessing step A7.

The preprocessing recipe prescribes preprocessing in which a process that should be applied to a product substrate W is applied to a dummy substrate DW. Therefore, the dummy substrate DW is worn down by applying preprocessing to the dummy substrate DW. In detail, preprocessing that uses a chemical liquid having an etching effect may be applied to a dummy substrate DW, and, as a result, a front surface of the dummy substrate DW may be etched, and the thickness of the dummy substrate DW may be reduced. Therefore, when the preprocessing recipe is performed, the controller 110 updates the dummy substrate history data 134 of the dummy-substrate slots DL1 to DL12 and DU1 to DU12 correlated with the processing units 11L to 43U (step A9). For example, if the dummy substrate history data 134 include number-of-uses data, the increment of the number-of-uses data is made. Thereafter, if the dummy substrate history data 134 have reached a set value, e.g., if the number-of-uses data have reached a set value (step A10: YES), the controller 110 warns the host computer 150 that the dummy substrate DW of the dummy slot has reached a validity limit (usage limit) (step A11). The host computer 150 warned thereby may urge a user to replace the dummy substrate DW with another by issuing a warning to the user, or may allow the dummy substrate DW to be automatically scheduled to be replaced with another.

When the preprocessing is finished, the controller 110 performs a control operation according to the product recipe (step A12). As a result, the main transfer robots 8L and 8U take the substrate W out of the substrate placing portions 6L and 6U, and transfer this substrate W to the processing units 11L to 43U (substrate carry-in step A121). Thereafter, a process step that uses a processing liquid (chemical liquid, rinse liquid, or the like) is applied to the substrate W in the processing units 11L to 43U (process step A122). After this step is finished, the main transfer robots 8L and 8U take out the already-processed substrate W, and transfer this substrate to the substrate placing portions 6L and 6U (substrate housing step A123). If a not-yet-processed substrate W exists (if a plurality of substrates W are consecutively processed) (step A13: YES), the same operation is repeatedly performed. If the number of substrates processed in the processing unit has reached a set value during this period (step A14: YES), the process returns to step A3, and a unit washing process is performed. If a plurality of substrates W are not consecutively processed (step A13: NO), the process returns to the start, and a substrate W is repeatedly processed from step A1.

If there is no processing request (processing reservation) from the host computer 150 (step A5: NO), the controller 110 determines whether the duration time of a standby state, i.e., the non-use duration time has reached the set value (step A15). If the non-use duration time has not reached the set value, a standby state is reached or continued. If the non-use duration time has reached the set value (step A15: YES), the controller 110 performs a preset maintenance process (step A16). The maintenance process may be a unit washing process. This unit washing process may be a process using a dummy substrate DW (kind of dummy processing) performed in the same way as in step A3, or may be a process not using a dummy substrate DW. Additionally, the maintenance process may be a process similar to the preprocessing. Additionally, the maintenance process may be another process. The maintenance process is, chiefly, a process performed to keep an environment in the processing chamber 35 of the processing units 11L to 43U in a state suitable to process a product substrate W, and may be a process preset by a user of the substrate processing apparatus 1. If the dummy processing that uses a dummy substrate DW is performed as a maintenance process, the maintenance process includes step A161 in which a dummy substrate DW is taken out of a corresponding dummy-substrate slot, and is carried into the processing unit, step A162 in which dummy processing that uses the dummy substrate DW is performed in the processing unit, and step A163 in which the dummy substrate DW is housed in a corresponding dummy-substrate slot after finishing the dummy processing.

The controller 110 cannot automatically schedule preprocessing to be performed in the same way as in the product recipe 131 at a point of time when there is no processing request (processing reservation) from the host computer 150. Therefore, if a processing request (processing reservation) is given from the host computer 150, it is preferable to perform preprocessing (step A7) corresponding to the product processing even when a maintenance process (step A16) is performed as needed.

A dummy substrate DW is beforehand introduced in the substrate processing apparatus 1, and is housed in the dummy-substrate housing portions 7L, 7U. In detail, a carrier C that houses a dummy substrate DW is delivered to the carrier holding portion 25, for example, by means of an automatic carrier transferring mechanism installed in a factory. The indexer robot 26 takes the dummy substrate DW out of the carrier C, and transfers this dummy substrate DW to the substrate placing portions 6L and 6U. The main transfer robot 8L of the first processing block layer BL transfers the dummy substrate DW from the substrate placing portion 6L to the dummy-substrate housing portion 7L, and houses the dummy substrate DW therein. The main transfer robot 8U of the second processing block layer BU transfers the dummy substrate DW from the substrate placing portion 6U to the dummy-substrate housing portion 7U, and houses the dummy substrate DW therein.

When a new dummy substrate DW is introduced and is housed in the dummy-substrate housing portions 7L, 7U, the controller 110 resets the dummy substrate history data 134 corresponding to the dummy-substrate slot in which the new dummy substrate DW is housed at the initial value.

When a dummy substrate DW in the substrate processing apparatus 1 is replaced, the dummy substrate DW is transferred from the dummy-substrate housing portion 7L, 7U to the carrier C held by the carrier holding portion 25 by means of the main transfer robot 8L, 8U and the indexer robot 26. In detail, when a dummy substrate DW, which is to be replaced, is housed in the dummy-substrate housing portion 7L of the first processing block layer BL, the main transfer robot 8L transfers this dummy substrate DW from the dummy-substrate housing portion 7L to the substrate placing portion 6L. When a dummy substrate DW, which is to be replaced, is housed in the dummy-substrate housing portion 7U of the second processing block layer BU, the main transfer robot 8U transfers this dummy substrate DW from the dummy-substrate housing portion 7U to the substrate placing portion 6U. The indexer robot 26 transfers a dummy substrate DW placed at the substrate placing portion 6L, 6U to the carrier C held by the carrier holding portion 25, and houses this dummy substrate DW therein. If a plurality of dummy substrates DW are to be replaced, the same operation is repeatedly performed.

As described above, according to the present preferred embodiment, the processing block 3 adjacent to the indexer block 2 in the lateral direction of the indexer block 2 is formed by stacking the plurality of processing block layers BL and BU together in the up-down direction Z. Additionally, each of the processing block layers BL and BU is provided with the dummy-substrate housing portion 7L, 7U that house dummy substrates DW, respectively. Dummy substrates DW can be housed in the processing block layers BL and BU, and therefore it is possible to transfer the dummy substrate DW between the dummy-substrate housing portions 7L, 7U and the processing units 11L to 43U without the participation of the indexer robot 26 when necessity to use a dummy substrate DW in the processing units 11L to 43U arises.

Therefore, it is possible to reduce the transfer load of the indexer robot 26, and therefore it is possible to perform processing that uses a dummy substrate DW while reducing influence on the transfer of a product substrate W. Particularly, the transfer load of the indexer robot 26 is very heavy because the indexer robot 26 transfers substrates W between the carrier holding portion 25 and the plurality of processing block layers BL and BU respectively having the plurality of processing units 11L to 43L and 11U to 43U. Therefore, the transfer efficiency of product substrates W is raised by reducing the transfer load of the indexer robot 26, hence making it possible to raise productivity. The main transfer robots 8L and 8U of each of the processing block layers BL and BU have the job of transferring substrates W in the processing block layer BL or BU, and therefore its transfer load is smaller than the indexer robot 26. Therefore, the fact that the main transfer robots 8L and 8U have the job of transferring substrates W in the processing block layers BL and BU does not cause a critical problem from the viewpoint of productive efficiency.

Additionally, the dummy-substrate housing portions 7L and 7U are provided within the processing block layers BL and BU, and therefore it is possible to transfer a dummy substrate DW between the dummy-substrate housing portions 7L and 7U and the processing units 11L to 43U without being transferred via the substrate placing portions 6L and 6U that are used to deliver a substrate between the indexer robot 26 and the processing block layers BL and BU. Therefore, it is possible to reduce interference between the transfer of a dummy substrate DW and the transfer of a product substrate W, and therefore it is possible to improve the transfer efficiency of the product substrate W, hence making it possible to raise productivity.

Additionally, unlike in the case of Japanese Patent Application Publication No. 2017-41506, the carrier holding portion 25 is never occupied by the dummy carrier that houses a dummy substrate DW for a long time. This makes it possible to reduce an event that a waiting time occurs for the carry-in of a carrier C housing a product substrate W, thus making it possible to contribute to productivity enhancement.

Additionally, in each of the processing block layers BL and BU, the plurality of processing units 11L to 43L and 11U to 43U are arranged on both sides of the transfer paths 51L and 51U along the transfer paths 51L and 51U along which a substrate W is transferred by the main transfer robots 8L and 8U, and are stacked together in the up-down direction Z in the present preferred embodiment. Therefore, the arrangement of the plurality of processing units 11L to 43U in the processing block layers BL and BU is designed so that substrates can be efficiently transferred by the main transfer robots 8L and 8U. This makes it possible to contribute to productivity enhancement.

Additionally, the substrate placing portions 6L and 6U and the dummy-substrate housing portions 7L and 7U are each disposed between the indexer robot 26 and the main transfer robots 8L and 8U in the present preferred embodiment. This makes it possible to efficiently perform the transfer of a substrate W between the indexer robot 26 and the main transfer robots 8L and 8U, which is performed via the substrate placing portions 6L and 6U. Additionally, it is possible to place the dummy-substrate housing portions 7L and 7U at a position at which interference does not occur between the transfer of a substrate W by the indexer robot 26 and the transfer of a substrate W by the main transfer robots 8L and 8U. Therefore, it is possible to hold a dummy substrate DW in the processing block layers BL and BU without affecting the transfer of the product substrate W.

More specifically, the dummy-substrate housing portions 7L and 7U and the substrate placing portions 6L and 6U are three-dimensionally disposed so as to have mutually different heights in the present preferred embodiment. This makes it possible to appropriately dispose the dummy-substrate housing portions 7L and 7U in the processing block layers BL and BU while effectively using a space in the processing block layers BL and the BU. As a result, the arrangement of the dummy-substrate housing portions 7L and 7U that does not obstruct the transfer of a product substrate W is realized.

Additionally, in the present preferred embodiment, the dummy-substrate housing portions 7L and 7U are disposed so as to overlap the substrate placing portions 6L and 6U in a plan view. Hence, the dummy-substrate housing portions 7L and 7U are disposed while using a space above or below the substrate placing portions 6L and 6U. As a result, the arrangement of the dummy-substrate housing portions 7L and 7U that does not obstruct the transfer of a product substrate W is realized, thus making it possible to dispose the dummy-substrate housing portions 7L and 7U while effectively using a space in the processing block layers BL and the BU. In detail, an arrangement in which the dummy-substrate housing portions 7L and 7U overlap the substrate placing portions 6L and 6U in a plan view may be an arrangement in which a portion or all of a dummy substrate DW housed in the dummy-substrate housing portions 7L and 7U lies over and covers a substrate W held by the substrate placing portions 6L and 6U as described above.

More specifically, the second processing block layer BU (upper processing block layer) is stacked on the first processing block layer BL (lower processing block layer) in the present preferred embodiment. In the first processing block layer BL, the dummy-substrate housing portion 7L is positioned below the substrate placing portion 6L. On the other hand, in the second processing block layer BU, the dummy-substrate housing portion 7U is positioned below the substrate placing portion 6U. This makes it possible to reduce a difference in height between the substrate placing portion 6L of the first processing block layer BL and the substrate placing portion 6U of the second processing block layer BU. As a result, it is possible to shorten a substrate transfer stroke in the up-down direction Z by means of the indexer robot 26, hence making it possible to reduce the transfer load of the indexer robot 26. Therefore, it is possible to raise the transfer efficiency of a product substrate W and to contribute to productivity enhancement.

Additionally, in the present preferred embodiment, the dummy-substrate housing portions 7L and 7U of each of the processing block layers BL and BU include the plurality of dummy-substrate slots DL1 to DL12 and DU1 to DU12 that are equal in number to the plurality of processing units 11L to 43L and 11U to 43U included in the processing block layer BL or BU. Each of the dummy-substrate slots DL1 to DL12 and DU1 to DU12 is configured to hold a single dummy substrate DW. This makes it possible to hold dummy substrates DW that are equal in number to the processing units 11L to 43L and 11U to 43U in each of the processing block layers BL and BU. Therefore, if necessity to carry a dummy substrate DW into any one of the processing units 11L to 43L and 11U to 43U arises, it is possible to perform dummy processing by swiftly carrying the dummy substrate DW into the processing unit by means of the main transfer robots 8L and 8U. The indexer robot 26 does not participate in the carry-in of the dummy substrate DW, and therefore it is possible to restrain or prevent the transfer of a product substrate W from being affected.

Additionally, in the present preferred embodiment, the plurality of processing units 11L to 43L and 11U to 43U of each of the processing block layers BL and BU and the plurality of dummy-substrate slots DL1 to DL12 and DU1 to DU12 of the processing block layer are correlated with each other in a one-to-one correspondence. The main transfer robots 8L and 8U transfer a dummy substrate DW between the dummy-substrate slots DL1 to DL12 and DU1 to DU12 and the processing units 11L to 43L and 11U to 43U that are correlated with each other. This configuration makes it possible to set a dummy substrate DW held by the dummy-substrate slot as a dummy substrate dedicated to a corresponding processing unit. As a result, the usage history of the dummy substrate DW is easily managed.

Additionally, in the present preferred embodiment, when a dummy processing condition (unit washing execution condition, preprocessing execution condition, and maintenance execution condition) is satisfied, the controller 110 allows the main transfer robots 8L and 8U to transfer a dummy substrate DW from the dummy-substrate housing portions 7L and 7U to the processing units 11L to 43L and 11U to 43U while controlling the main transfer robots 8L and 8U, and allows the dummy substrate DW to undergo dummy processing in the processing unit. As thus described, it is possible to start dummy processing by transferring a dummy substrate DW in the processing block layers BL and BU, and therefore it is possible to swiftly start dummy processing while restraining or preventing the transfer of a product substrate W from being affected.

Additionally, according to the present preferred embodiment, the following steps are performed by allowing the controller 110 to control each component of the substrate processing apparatus 1. In detail, a dummy substrate carrying-in step (steps A31, A71, A161) is performed in which, in each of the processing block layers BL and BU, the main transfer robots 8L and 8U carry a dummy substrate DW housed in the dummy-substrate housing portions 7L and 7U included in the processing block layer into any one of the plurality of processing units 11L to 43L and 11U to 43U included in the processing block layer. Thereafter, a dummy processing step (steps A32, A72, A162) is performed in which, in the processing unit, dummy processing that uses the dummy substrate DW carried thereinto is performed. After finishing the dummy processing, a step (steps A33, A73, A163) is performed in which the main transfer robots 8L and 8U take the dummy substrate DW out of the processing unit, and transfer the dummy substrate DW to the dummy-substrate housing portions 7L and 7U. Thereafter, a step (step A121) is performed in which a substrate W placed at the substrate placing portions 6L and 6U of the processing block layer BL or BU is carried into any one of the plurality of processing units 11L to 43L and 11U to 43U of the processing block layer BL or BU. Thereafter, a step (step A122) is performed in which, in the processing unit, the substrate W carried thereinto is processed. This makes it possible to perform processing that uses the dummy substrate DW in the processing units 11L to 43L and 11U to 43U of each of the processing block layers BL and BU while reducing the transfer load of the indexer robot 26. As a result, it is possible to improve productive efficiency.

The dummy substrate carrying-in step (step A71) may be performed in parallel with or prior to the substrate carry-in step (step A20) in which the indexer robot 26 takes a substrate W out of the carrier C held by the carrier holding portion 25, and carries the substrate W into the substrate placing portions 6L and 6U of either one of the processing block layers BL and BU while being controlled by the controller 110. This makes it possible to allow the indexer robot 26 to carry a product substrate W into the processing block layers BL and BU, and, on the other hand, to carry a dummy substrate DW into the processing units 11L to 43L and 11U to 43U in each of the processing block layers BL and BU. The indexer robot 26 is not required to participate in the carry-in of the dummy substrate DW, and therefore it is possible to transfer the dummy substrate DW in the processing block layers BL and BU without waiting for the transfer of a substrate W by means of the indexer robot 26 or in parallel with the transfer of the substrate W. Therefore, it is possible to reduce the transfer load of the indexer robot 26, and, in addition to this, it is possible to swiftly transfer a dummy substrate DW to the processing unit in the processing block layers BL and BU.

Additionally, the dummy processing step (step A72) may be performed in parallel with or prior to the substrate carry-in step (step A20) in which a product substrate W is carried into the substrate placing portions 6L and 6U by means of the indexer robot 26 while being controlled by the controller 110. This makes it possible to reduce the transfer load of the indexer robot 26, and, in addition to this, makes it possible to swiftly start dummy processing in the processing block layers BL and BU. For example, when a request to perform substrate processing is received from the host computer 150, it is possible to start transferring a dummy substrate DW at an appropriate time in response to the request and, subsequent to this, to start performing dummy processing. This makes it possible to adjust an environment in the processing units 11L to 43L and 11U to 43U at an appropriate time, hence making it possible to swiftly start the processing operation of a product substrate W when the carrier C housing the product substrate W is carried into the carrier holding portion 25. This makes it possible to contribute to productivity enhancement.

Although the preferred embodiment of the present invention has been described as above, the present invention can also be embodied in other modes. For example, the processing block 3 is configured by stacking the two processing block layers BL and BU together as described in the above preferred embodiment, and yet the processing block may be configured by stacking three or more processing block layers together. Additionally, each of the processing block layers BL and BU has processing units having a three-stacked structure as described in the above preferred embodiment, and yet the processing units included in each of the processing block layers may have a two-stacked structure, or may have a four or more-stacked structure, or all processing units may be disposed in a one-stacked structure. Additionally, the processing units 11L to 43U are disposed on both sides of the transfer paths 51L and 51U as described in the above preferred embodiment, and yet the processing units may be disposed on one side of the transfer paths 51L and 51U. Additionally, the two processing units are disposed on one side of the transfer paths 51L and 51U along the transfer path 51L or 51U as described in the above preferred embodiment, and yet one processing unit may be disposed there, or three or more processing units may be disposed there.

Additionally, the windows 4L and 4U corresponding to the substrate placing portions 6L and 6U are formed in the adjoining rear and front partition walls 2a and 3a of the indexer block 2 and the processing block 3 as described in the above preferred embodiment, and windows corresponding to the dummy-substrate housing portions 7L and 7U are not formed. However, windows corresponding to the dummy-substrate housing portions 7L and 7U may be added to the rear and front partition walls 2a and 3a. The addition of these windows enables the indexer robot 26 to directly access the dummy-substrate housing portions 7L and 7U and to carry a dummy substrate DW into the dummy-substrate housing portions 7L and 7U when the dummy substrate DW is introduced into the processing block layers BL and BU. However, the dummy substrate DW is not required to be frequently carried thereinto, and therefore, practically, there is no necessity to additionally provide windows as described above.

Additionally, as described in the above preferred embodiment, the dummy-substrate slots DL1 to DL12 and DU1 to DU12 that are equal in number to the processing units 11L to 43L and 11U to 43U are provided in the dummy-substrate housing portions 7L and 7U of each of the processing block layers BL and BU, and these dummy-substrate slots DL1 to DL12 and DU1 to DU12 are correlated with the processing units 11L to 43L and 11U to 43U in a one-to-one correspondence. However, for example, the dummy-substrate slots in each of the processing block layers BL and BU may be made smaller in number than the processing units, and one dummy-substrate slot may be correlated with the plurality of processing units.

Although the preferred embodiments of the present invention have been described in detail, these are merely concrete examples used to clarify the technical contents of the present invention, and the present invention should not be understood by being limited to these concrete examples, and the scope of the present invention is limited solely by the appended claims.

What is claimed is:

1. A substrate processing apparatus comprising:
an indexer block; and
a processing block that is adjacent to the indexer block in a lateral direction of the indexer block and in which a plurality of processing block layers are stacked in an up-down direction,
the indexer block comprising:
a container holding portion that holds a substrate container that houses a substrate; and
a first transfer robot that transfers the substrate between the substrate container held by the container holding portion and the processing block,
each processing block layer comprising:
a plurality of processing units that perform substrate processing;
a substrate placing portion that temporarily holds the substrate that is delivered between the first transfer robot and the processing block layer;
a dummy-substrate housing portion that houses at least one dummy substrate that is usable in the plurality of processing units; and
a second transfer robot that transfers the substrate between the substrate placing portion and the plurality of processing units and that transfers the dummy substrate between the dummy-substrate housing portion and the plurality of processing units,
wherein the dummy-substrate housing portion of each processing block layer includes a plurality of dummy-substrate slots that are equal in number to the plurality of processing units included in the processing block layer, and each dummy-substrate slot is configured to hold a single of the at least one dummy substrate.

2. The substrate processing apparatus according to claim 1, wherein, in each processing block layer, the plurality of processing units are arranged along a transfer path along which the substrate is transferred by the second transfer robot on both sides of the transfer path, and are stacked in the up-down direction.

3. The substrate processing apparatus according to claim 1,
wherein the substrate placing portion is disposed between the first transfer robot and the second transfer robot, and the dummy-substrate housing portion is disposed between the first transfer robot and the second transfer robot.

4. The substrate processing apparatus according to claim 1, wherein the dummy-substrate housing portion is disposed at a height different from a height of the substrate placing portion.

5. The substrate processing apparatus according to claim 4, wherein the dummy-substrate housing portion is disposed so as to overlap the substrate placing portion when viewed in plan.

6. The substrate processing apparatus according to claim 1,
wherein the plurality of processing block layers include a first processing block layer and a second processing block layer disposed above the first processing block layer, and,
in the first processing block layer, the dummy-substrate housing portion is positioned below the substrate placing portion, and,
in the second processing block layer, the dummy-substrate housing portion is positioned above the substrate placing portion.

7. The substrate processing apparatus according to claim 1, wherein the plurality of processing units of each processing block layer are correlated with the plurality of dummy-substrate slots of the processing block layer in a one-to-one correspondence, and the second transfer robot transfers the dummy substrate between the dummy-substrate slot and the processing unit that correspond to each other.

8. A substrate processing apparatus comprising:
an indexer block; and
a processing block that is adjacent to the indexer block in a lateral direction of the indexer block and in which a plurality of processing block layers are stacked in an up-down direction,
the indexer block comprising:
a container holding portion that holds a substrate container that houses a substrate; and
a first transfer robot that transfers the substrate between the substrate container held by the container holding portion and the processing block,
each processing block layer comprising:
a plurality of processing units that perform substrate processing;
a substrate placing portion that temporarily holds the substrate that is delivered between the first transfer robot and the processing block layer;
a dummy-substrate housing portion that houses at least one dummy substrate that is usable in the plurality of processing units; and
a second transfer robot that transfers the substrate between the substrate placing portion and the plurality of processing units and that transfers the dummy substrate between the dummy-substrate housing portion and the plurality of processing units,
the substrate processing apparatus further comprising a controller configured to record a usage history of the dummy substrate housed in the dummy-substrate housing portion and to issue a warning based on the usage history of the dummy substrate when the dummy substrate reaches a usage limit.

9. A substrate processing apparatus comprising:
an indexer block; and
a processing block that is adjacent to the indexer block in a lateral direction of the indexer block and in which a plurality of processing block layers are stacked in an up-down direction,
the indexer block comprising:
a container holding portion that holds a substrate container that houses a substrate; and
a first transfer robot that transfers the substrate between the substrate container held by the container holding portion and the processing block,
each processing block layer comprising:
a plurality of processing units that perform substrate processing;
a substrate placing portion that temporarily holds the substrate that is delivered between the first transfer robot and the processing block layer;

a dummy-substrate housing portion that houses at least one dummy substrate that is usable in the plurality of processing units for dummy processing;

a second transfer robot that transfers the substrate between the substrate placing portion and the plurality of processing units and that transfers the dummy substrate between the dummy-substrate housing portion and the plurality of processing units; and a controller configured to control the second transfer robot and the processing unit, wherein the dummy processing includes a maintenance process in which maintenance of the processing unit is performed, and wherein the controller is configured to control the second transfer robot so as to transfer the dummy substrate from the dummy-substrate housing portion to the processing unit when a dummy processing condition is satisfied, and is configured to control the processing unit so as to perform dummy processing.

10. The substrate processing apparatus according to claim 9, wherein the maintenance process includes at least one of a preparation process in which an environment is adjusted to process the substrate housed in the substrate container held by the container holding portion and a unit washing process in which an inside of the processing unit is washed and cleaned.

11. A substrate processing method that is executed in a substrate processing apparatus including a container holding portion that holds a substrate container that houses a substrate, an indexer block that has a first transfer robot that transfers the substrate between a substrate container held by the container holding portion and a processing block, and the processing block that is adjacent to the indexer block in a lateral direction of the indexer block and in which a plurality of processing block layers are stacked in an up-down direction, each processing block layer including:
a plurality of processing units that perform substrate processing;
a substrate placing portion that temporarily holds the substrate that is delivered between the first transfer robot and the processing block layer;
a dummy-substrate housing portion that houses a dummy substrate that is usable in the plurality of processing units; and
a second transfer robot that transfers the substrate between the substrate placing portion and the plurality of processing units and that transfers the dummy substrate between the dummy-substrate housing portion and the plurality of processing units, the substrate processing apparatus executing:
a dummy substrate carrying-in step in which, in each processing block layer, the second transfer robot carries the dummy substrate housed in the dummy-substrate housing portion in the processing block layer into any one of the plurality of processing units in the processing block layer;
a dummy processing step in which dummy processing that uses the dummy substrate carried into any one of the plurality of processing units is performed in the processing unit;
a step in which, after finishing the dummy processing, the second transfer robot takes the dummy substrate out of the processing unit, and transfers the dummy substrate to the dummy-substrate housing portion;
a step in which the second transfer robot carries the substrate placed in the substrate placing portion of the processing block layer into any one of the plurality of processing units of the processing block layer; and
a step in which the substrate carried into any one of the plurality of processing units is processed in the processing unit,
wherein the dummy processing includes a maintenance process in which maintenance of the processing unit is performed.

12. The substrate processing method according to claim 11, wherein the maintenance process includes at least one of a preparation process in which an environment is adjusted to process the substrate and a unit washing process in which an inside of the processing unit is washed and cleaned.

13. The substrate processing method, according to claim 11,
wherein the substrate placing portion is disposed between the first transfer robot and the second transfer robot, and the dummy-substrate housing portion is disposed between the first transfer robot and the second transfer robot.

14. The substrate processing method according to claim 11, wherein the dummy substrate carrying-in step is executed in parallel with or prior to a substrate carry-in step in which the first transfer robot takes the substrate out of the substrate container, and carries the substrate into the substrate placing portion of one of the plurality of processing block layers.

15. The substrate processing method according to claim 14, wherein the dummy processing step is executed in parallel with or prior to the substrate carry-in step.

* * * * *